US008993450B2

(12) United States Patent
Sherrer

(10) Patent No.: US 8,993,450 B2
(45) Date of Patent: Mar. 31, 2015

(54) DEVICE PACKAGE AND METHODS FOR THE FABRICATION AND TESTING THEREOF

(71) Applicant: Nuvotronics, LLC, Radford, VA (US)

(72) Inventor: David W Sherrer, Cary, NC (US)

(73) Assignee: Nuvotronics, LLC, Radford, VA (US)

( * ) Notice: Subject to any disclaimer, the term of this patent is extended or adjusted under 35 U.S.C. 154(b) by 0 days.

(21) Appl. No.: 14/258,358

(22) Filed: Apr. 22, 2014

(65) Prior Publication Data

US 2014/0226690 A1 Aug. 14, 2014

Related U.S. Application Data

(60) Continuation of application No. 12/944,040, filed on Nov. 11, 2010, now Pat. No. 8,703,603, which is a continuation of application No. 11/590,099, filed on Oct. 31, 2006, now Pat. No. 7,888,793, which is a (Continued)

(51) Int. Cl.
*H01S 5/022* (2006.01)
*G02B 6/42* (2006.01)

(Continued)

(52) U.S. Cl.
CPC .............. *H01S 5/022* (2013.01); *G02B 6/4201* (2013.01); *G02B 6/4204* (2013.01); *G02B 6/4206* (2013.01); *G02B 6/421* (2013.01); *G02B 6/4214* (2013.01); *G02B 6/423* (2013.01); *G02B 6/4239* (2013.01); *G02B 6/4248* (2013.01);

(Continued)

(58) Field of Classification Search
CPC ............ H01L 29/84; H01L 2924/0002; H01J 2237/0206; H01J 2237/2446; H01S 5/0222
See application file for complete search history.

(56) References Cited

U.S. PATENT DOCUMENTS 731,445 A 6/1903 Esterly
4,771,630 A 9/1988 Croce
(Continued)

FOREIGN PATENT DOCUMENTS

CN 1094450 A 11/1994
CN 1261782 A 8/2000
(Continued)

OTHER PUBLICATIONS

Communication issued on Jun. 24, 2011 in the corresponding European Patent Application No. 08151799.7.
(Continued)

*Primary Examiner* — Roy Potter
(74) *Attorney, Agent, or Firm* — Niels Haun; Dann Dorfman Herrell & Skillman, PC

(57) ABSTRACT

Provided are methods of forming sealed via structures. One method involves: (a) providing a semiconductor substrate having a first surface and a second surface opposite the first surface; (b) forming a layer on the first surface of the substrate; (c) etching a via hole through the substrate from the second surface to the layer, the via hole having a first perimeter at the first surface; (d) forming an aperture in the layer, wherein the aperture has a second perimeter within the first perimeter; and (e) providing a conductive structure for sealing the via structure. Also provided are sealed via structures, methods of detecting leakage in a sealed device package, sealed device packages, device packages having cooling structures, and methods of bonding a first component to a second component.

21 Claims, 26 Drawing Sheets

Related U.S. Application Data division of application No. 10/941,667, filed on Sep. 15, 2004, now Pat. No. 7,129,163.

(60) Provisional application No. 60/502,868, filed on Sep. 15, 2003.

(51) Int. Cl.
  *G01B 11/26* (2006.01)
  *H01L 23/48* (2006.01)
  *H01S 5/00* (2006.01)
  *H01S 5/024* (2006.01)
  *H01S 5/0683* (2006.01)

(52) U.S. Cl.
  CPC .......... *G02B6/4292* (2013.01); *H01S 5/02252* (2013.01); *G01B 11/26* (2013.01); *H01L 23/481* (2013.01); *H01S 5/0014* (2013.01); *H01S 5/02208* (2013.01); *H01S 5/02216* (2013.01); *H01S 5/02284* (2013.01); *H01S 5/02415* (2013.01); *H01S 5/02469* (2013.01); *H01S 5/0683* (2013.01); *H01L 2924/0002* (2013.01); *H01S 5/0222* (2013.01)
  USPC .......................... 438/704; 438/15; 372/44.01

(56) References Cited

U.S. PATENT DOCUMENTS

| | | | |
|---|---|---|---|
| 4,893,499 A * | 1/1990 | Layton et al. ................ 73/49.3 |
| 4,897,711 A | 1/1990 | Blonder |
| 5,032,897 A | 7/1991 | Mansuria |
| 5,082,339 A | 1/1992 | Linnebach |
| 5,177,753 A | 1/1993 | Tanaka |
| 5,201,987 A | 4/1993 | Hawkins |
| 5,231,686 A | 7/1993 | Rabinovich |
| 5,259,054 A | 11/1993 | Benzoni |
| 5,262,921 A | 11/1993 | Lamers |
| 5,287,001 A | 2/1994 | Buchmann |
| 5,289,345 A | 2/1994 | Corradetti |
| 5,291,572 A | 3/1994 | Blonder |
| 5,307,139 A | 4/1994 | Tyson |
| 5,308,442 A | 5/1994 | Taub |
| 5,327,443 A | 7/1994 | Tanaka |
| 5,351,163 A | 9/1994 | Dawson |
| 5,412,748 A | 5/1995 | Furuyama |
| 5,432,998 A | 7/1995 | Galasco |
| 5,448,014 A | 9/1995 | Kong |
| 5,479,540 A | 12/1995 | Boudreau |
| 5,552,635 A | 9/1996 | Kim |
| 5,713,508 A | 2/1998 | Gaynes |
| 5,727,104 A | 3/1998 | Sasaki |
| 5,740,261 A | 4/1998 | Loeppert |
| 5,742,261 A | 4/1998 | Yuki |
| 5,812,717 A | 9/1998 | Gilliland |
| 5,891,354 A | 4/1999 | Lee |
| 5,915,168 A | 6/1999 | Salatino |
| 5,966,291 A | 10/1999 | Baumel |
| 5,978,220 A | 11/1999 | Frey |
| 6,036,872 A | 3/2000 | Wood |
| 6,091,027 A | 7/2000 | Hesselbom |
| 6,091,603 A | 7/2000 | Daves |
| 6,094,919 A | 8/2000 | Bhatia |
| 6,110,825 A | 8/2000 | Mastromatteo |
| 6,133,631 A | 10/2000 | Belady |
| 6,139,761 A | 10/2000 | Ohkuma |
| 6,167,751 B1 | 1/2001 | Fraim |
| 6,180,261 B1 | 1/2001 | Inoue |
| 6,221,769 B1 | 4/2001 | Dhong |
| 6,228,675 B1 | 5/2001 | Ruby |
| 6,275,513 B1 | 8/2001 | Chang-Hasnain |
| 6,351,027 B1 | 2/2002 | Giboney |
| 6,354,747 B1 | 3/2002 | Irie |
| 6,358,066 B1 | 3/2002 | Gilliland |
| 6,359,333 B1 | 3/2002 | Wood |
| 6,392,158 B1 | 5/2002 | Caplet |
| 6,422,766 B1 | 7/2002 | Althaus |
| 6,439,032 B1 | 8/2002 | Lehmann |
| 6,452,798 B1 | 9/2002 | Smith |
| 6,477,056 B1 | 11/2002 | Edwards |
| 6,582,992 B2 | 6/2003 | Poo |
| 6,611,052 B2 | 8/2003 | Poo |
| 6,660,564 B2 | 12/2003 | Brady |
| 6,746,158 B2 | 6/2004 | Merrick |
| 6,768,205 B2 | 7/2004 | Taniguchi |
| 6,773,532 B2 | 8/2004 | Wolf |
| 6,776,623 B1 | 8/2004 | Yunker |
| 6,818,464 B2 | 11/2004 | Heschel |
| 6,843,107 B2 | 1/2005 | Newman |
| 6,864,172 B2 | 3/2005 | Noma |
| 6,992,887 B2 | 1/2006 | Jairazbhoy |
| 7,129,163 B2 | 10/2006 | Sherrer |
| 7,160,039 B2 | 1/2007 | Hargis |
| 7,449,784 B2 | 11/2008 | Sherrer |
| 7,508,065 B2 | 3/2009 | Sherrer |
| 7,633,159 B2 | 12/2009 | Boon |
| 7,704,796 B2 | 4/2010 | Pagaila |
| 8,203,207 B2 | 6/2012 | Getz |
| 2002/0037143 A1 | 3/2002 | Kuhara |
| 2002/0111035 A1 | 8/2002 | Atobe |
| 2002/0113296 A1 | 8/2002 | Cho |
| 2003/0034438 A1 | 2/2003 | Sherrer |
| 2003/0045085 A1 | 3/2003 | Taniguchi et al. |
| 2003/0071283 A1 | 4/2003 | Heschel |
| 2003/0081914 A1 | 5/2003 | Steinberg |
| 2003/0104651 A1 | 6/2003 | Kim |
| 2003/0128854 A1 | 7/2003 | Mullenborn |
| 2003/0159772 A1 | 8/2003 | Wolf |
| 2003/0161026 A1 | 8/2003 | Qin |
| 2003/0161133 A1 | 8/2003 | Fu |
| 2003/0161363 A1 | 8/2003 | Wolf |
| 2003/0161603 A1 | 8/2003 | Nadeau |
| 2003/0169983 A1 | 9/2003 | Branch |
| 2003/0183920 A1 | 10/2003 | Goodrich |
| 2003/0183921 A1 | 10/2003 | Komobuchi |
| 2003/0206703 A1 | 11/2003 | Chiu |
| 2004/0012083 A1 | 1/2004 | Farrell |
| 2004/0016942 A1 | 1/2004 | Miyazawa |
| 2004/0067604 A1 | 4/2004 | Ouellet |
| 2004/0076384 A1 | 4/2004 | Kato |
| 2004/0077117 A1 | 4/2004 | Ding |
| 2004/0077139 A1 | 4/2004 | Silverbrook |
| 2004/0091268 A1 | 5/2004 | Hogan |
| 2004/0101259 A1 | 5/2004 | Kilian |
| 2004/0104460 A1 | 6/2004 | Stark |
| 2004/0188822 A1 | 9/2004 | Hara |
| 2004/0240497 A1 | 12/2004 | Oomori |
| 2004/0264866 A1 | 12/2004 | Sherrer |
| 2005/0059204 A1 | 3/2005 | Heschel |
| 2005/0110157 A1 | 5/2005 | Sherrer |
| 2005/0111797 A1 | 5/2005 | Sherrer |
| 2005/0135758 A1 | 6/2005 | Sato |
| 2005/0141828 A1 | 6/2005 | Narayan |
| 2005/0250253 A1 | 11/2005 | Cheung |
| 2005/0265722 A1 | 12/2005 | Gallup |
| 2005/0286901 A1 | 12/2005 | Sasser |
| 2006/0002667 A1 | 1/2006 | Aronson |
| 2006/0072883 A1 | 4/2006 | Kilian |
| 2006/0094158 A1 | 5/2006 | Lee |
| 2006/0094231 A1 | 5/2006 | Lane |
| 2006/0278821 A1 | 12/2006 | Sherrer |
| 2007/0002927 A1 | 1/2007 | Finot |
| 2007/0081770 A1 | 4/2007 | Fisher |
| 2007/0262381 A1 | 11/2007 | Kojima |
| 2007/0278666 A1 | 12/2007 | Garcia |
| 2008/0076195 A1 | 3/2008 | Shiv |
| 2009/0065907 A1 | 3/2009 | Haba |
| 2009/0267096 A1 | 10/2009 | Kim |
| 2011/0079893 A1 | 4/2011 | Sherrer |

FOREIGN PATENT DOCUMENTS

| | | |
|---|---|---|
| EP | 0430593 A2 | 6/1991 |
| EP | 0448713 A1 | 7/1991 |

(56) References Cited

FOREIGN PATENT DOCUMENTS

| | | |
|---|---|---|
| EP | 0465230 A2 | 1/1992 |
| EP | 0590393 A1 | 4/1994 |
| EP | 0911111 A2 | 4/1999 |
| EP | 1002612 A1 | 5/2000 |
| EP | 1061578 A1 | 12/2000 |
| EP | 1168021 A2 | 1/2002 |
| EP | 1321931 A2 | 6/2003 |
| EP | 1333267 A1 | 8/2003 |
| EP | 1729159 A1 | 12/2006 |
| GB | 2136203 A | 9/1984 |
| GB | 2312551 A | 10/1997 |
| GB | 2419684 A | 5/2006 |
| JP | 2053007 | 2/1990 |
| JP | 4000782 | 1/1992 |
| JP | 06020930 | 1/1994 |
| JP | H0620930 A | 1/1994 |
| JP | H06020705 | 1/1994 |
| JP | H06020766 | 1/1994 |
| JP | H06149483 A | 5/1994 |
| JP | H07086693 | 3/1995 |
| JP | 06149483 | 1/1996 |
| JP | 10170771 | 6/1998 |
| JP | 1999086312 | 3/1999 |
| JP | H1186312 A | 3/1999 |
| JP | H11295560 A | 10/1999 |
| JP | 2000311961 | 11/2000 |
| JP | 2002510863 A | 4/2002 |
| JP | 2002176039 | 6/2002 |
| JP | 2002341189 | 11/2002 |
| JP | 2002357743 | 12/2002 |
| JP | 2003046014 | 2/2003 |
| JP | 2003078080 A | 3/2003 |
| JP | 2005506701 A | 3/2005 |
| WO | 9814813 A1 | 4/1998 |
| WO | 9827588 | 6/1998 |
| WO | 9827588 A1 | 6/1998 |
| WO | 9950905 | 10/1999 |
| WO | 0031771 A1 | 6/2000 |
| WO | 0042464 | 7/2000 |
| WO | 0143181 A1 | 6/2001 |
| WO | 03034490 | 4/2003 |
| WO | 03046630 A1 | 6/2003 |
| WO | 03046640 A1 | 6/2003 |
| WO | 2004025239 A2 | 3/2004 |
| WO | 2006097842 A1 | 9/2006 |

OTHER PUBLICATIONS

European Examination Report dated Mar. 21, 2013 for EP Application No. 07150463.3.
European Search Report of corresponding European Application No. 04255517.7-2203.
European Search Report of corresponding European Application No. EP 08 15 1799 mailed Jun. 6, 2008.
European Search Report of European Application No. 04255516.9 mailed Apr. 26, 2005.
Kutchovkov et al., "New Fabrication Technology for Wafer-Through Hole Interconnects", Proceed. SeSens 2001, pp. 813-817.
Lee et al., 'Au—In Bonding Below the Eutectic Temperature', IEEE Transactions on Components, Hybrids and Manufacturing Technology, vol. 16, No. 3, May 1993, pp. 311-316.
Lee et al., 'High Temperature Tin-Cooper Joints at Low Process Temperature for Stress Reduction', Thin solid Films 286 (1996), pp. 213-218.
Lee et al., "Advances in Bonding Technology for Electronic Packaging", Journal of Electronic Packaging, vol. 115, Jun. 1993, pp. 201-207.
Lee et al., "High Temperature Silver—Indium Joints Manufactured at Low Temperature", Thin Solid Films 366 (2000), pp. 196-201.
Linder et al., 'Fabrication Technology for Wafer Through-Hole Interconnections and Three-Dimensional Stacks of Chips and Wafers', IEEE, 1994, pp. 349-354.
Nguyen et al., 'Through-Wafer Copper Electroplating for Three Dimensional Interconnects', J. Micromech, Microeng. 12 (2002) pp. 395-399.
Ok et al., 'High Density, High Aspect Ratio Through-Wafer Electrical Interconnect Vias for MEMS Packaging', IEEE Transactions of Advanced Packaging, vol. 26, No. 3, Aug. 2003, pp. 302-309.
Patent Invalidation Search, Nuvotronics, LLC, Aug. 18, 2011, pp. 1-31.
Pham et al., 'A Novel Micromachining Process Using Pattern Transfer Over Large Topography for RF Silicon Technology', Proceedings of the SAFE/IEEE workshop, Nov. 2000, pp. 125-128.
Rasmussen et al., 'Batch Fabrication of Through-Wafer Vias in CMOS Wafers for 3-D Packaging Applications', IEEE, 2003 Electronic Components and Technology Conference, pp. 634-639.
Rosen et al., 'Membrane Covered Electrically Isolated Through-Wafer Via Holes', J. Microetch, Microeng. 11 (2001), pp. 344-347.
Saito, Y., Fontaine, D., Rollin, J-M., Filipovic, D., 'Micro-Coaxial Ka-Band Gysel Power Dividers,' Microwave Opt Technol Lett 52: 474-478, 2010, Feb. 2010.

* cited by examiner

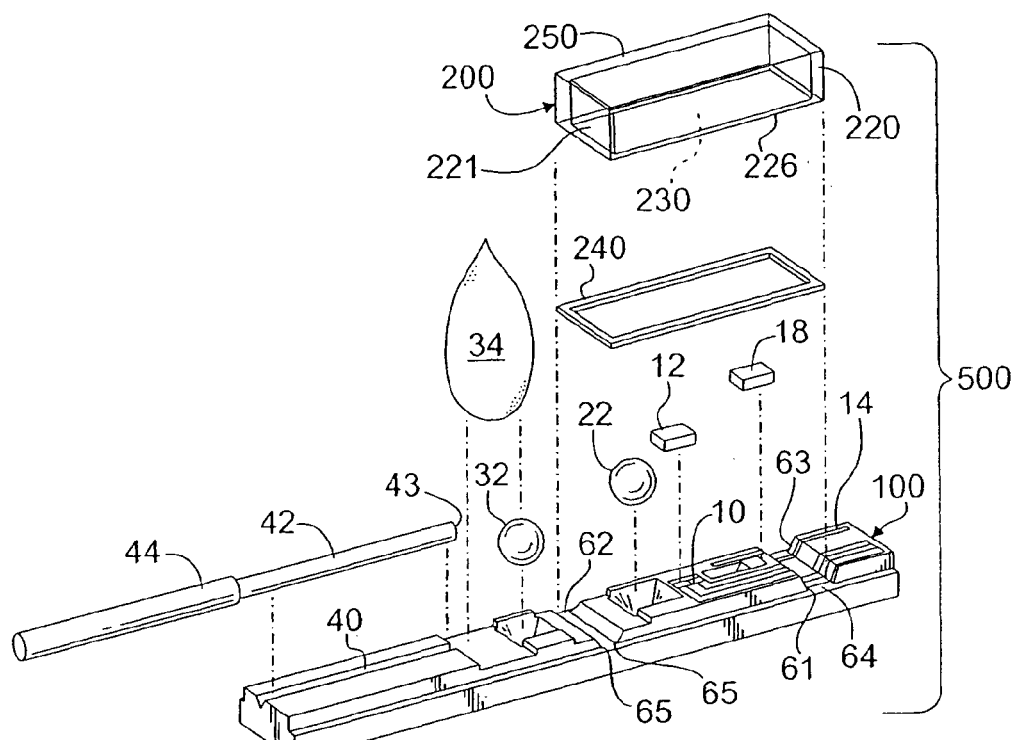
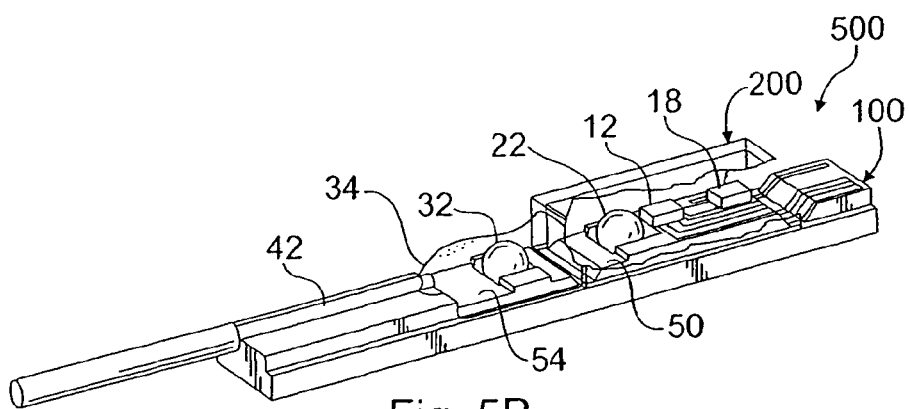

DEVICE PACKAGE AND METHODS FOR THE FABRICATION AND TESTING THEREOF

CROSS-REFERENCE TO RELATED APPLICATIONS

This application is a continuation of U.S. patent application Ser. No. 12/944,040, filed Nov. 11, 2010, which issued as U.S. Pat. No. 8,703,603 on Apr. 22, 2014, which is a continuation of U.S. patent application Ser. No. 11/590,099, filed Oct. 31, 2006, which issued as U.S. Pat. No. 7,888,793 on Feb. 15, 2011, which is a divisional of U.S. patent application Ser. No. 10/941,667, filed Sep. 15, 2004, which issued as U.S. Pat. No. 7,129,163 on Oct. 31, 2006, which claims the benefit of U.S. Provisional Application No. 60/502,868, filed Sep. 15, 2003, the entire contents of which are incorporated by reference herein.

FIELD OF THE INVENTION

The present invention relates generally to device packages, and in particular but not exclusively to hermetically sealed micro-optical device packages. The invention further relates to methods of testing device packages, such as methods of detecting leakage in and methods of electrically and optically testing device packages. The invention still further relates to sealed via structures, to connectorized optoelectronic devices, and to optoelectronic device package lids. Still further, the invention relates to methods of bonding components together.

BACKGROUND OF THE INVENTION

Optoelectronic devices play a crucial role in data communications. Yet, to advance the adoption and use of such devices, the ability to manufacture optoelectronic devices efficiently is desirable in reaching the low cost targets demanded. Of particular importance is reducing the cost of the process of packaging optoelectronic devices, since a large portion of the cost of an optoelectronic communications device (up to 75%) is packaging cost. Packaging is typically conducted on a unit-by-unit basis. Techniques which would allow for the manufacture of optoelectronic device packages on a large scale, for example, on a wafer- or grid-level would therefore be beneficial from the cost standpoint.

Hermetically sealed optoelectronic device packages are known. Such packages provide for containment and protection of the enclosed devices and components from contamination and water vapor present in the atmosphere outside of the package. Such packages also provide the ability to couple the packaged optoelectronic devices to other optical components, such as optical fibers. These packages typically include an open-top case made of Kovar which includes a cavity region in which a laser is mounted. An optical fiber is provided which extends into the cavity through a feedthrough in the sidewall of the case and a cover is attached to the case to seal the cavity. There are various drawbacks associated with the use of such a fiber feedthrough. For example, where a metallized fiber is used in forming the hermetic seal, the cost can be very high. In addition, it is difficult to effectively seal the fiber in the feedthrough, making the package susceptible to leakage and loss in hermeticity. A hermetic package not relying on a fiber feedthrough would therefore be desirable.

Further, leakage in device packages typically result in exposure of the contained components to water vapor and contaminants, causing performance degradation of the components. This is particularly the case for optoelectronic and optical components. A simple technique for testing the hermeticity of the sealed device package would thus be beneficial.

There is thus a need in the art for technology that overcomes or conspicuously ameliorates one or more of the problems described above with respect to the state of the art.

SUMMARY OF THE INVENTION

According to a first aspect of the invention, an optoelectronic device package is provided. The packages include a base substrate having an optoelectronic device mounting region on a surface of the base substrate and a lid mounting region. An optoelectronic device is mounted on the optoelectronic device mounting region. A lid is mounted on the lid mounting region to form an enclosed volume between the base substrate and the lid. The optoelectronic device is in the enclosed volume. The lid has an optically transmissive region suitable for transmitting light of a given wavelength along an optical path to or from the optoelectronic device, wherein at least a portion of the lid mounting region is disposed along the optical path below the surface of the base substrate to a depth below the optical path.

According to a further aspect of the invention, a wafer- or grid-level optoelectronic device package lid is provided. The lid includes a silicon wafer or grid having a plurality of die, wherein each die has a plurality of sidewalls and a roof connected to the sidewalls to form a cavity. One or more sidewall has an optically transmissive region suitable for transmitting light of a given wavelength along an optical axis through the sidewall.

According to a further aspect of the invention, a method of forming an optoelectronic device lid on a wafer or grid level is provided. The method involves: providing a silicon wafer or grid having a plurality of die; and etching the wafer or grid to produce a plurality of lid structures each having a plurality of sidewalls and a roof connected to the sidewalls to form a cavity. One or more sidewall of each lid structure has an optically transmissive region suitable for transmitting light of a given wavelength along an optical axis through the sidewall.

According to a further aspect of the invention, a connectorized optoelectronic device is provided. The device includes a connector having an interior cavity and an optical port, and an optoelectronic device package disposed in the cavity in optical communication with the optical port.

The optoelectronic device package may include a base substrate having an optoelectronic device mounting region and a lid mounting region; an optoelectronic device mounted on the optoelectronic device mounting region; and a lid mounted on the lid mounting region to form an enclosed volume between the base substrate and the lid. The lid has an optically transmissive region suitable for transmitting light of a given wavelength along an optical axis to or from the optoelectronic device.

According to a further aspect of the invention, a method of forming a sealed via structure is provided. The method includes: (a) providing a semiconductor substrate having a first surface and a second surface opposite the first surface; (b) forming a layer on the first surface of the substrate; (c) etching a via hole through the substrate from the second surface to the layer, the via hole having a first perimeter at the first surface; (d) forming an aperture in the layer, wherein the aperture has a second perimeter within the first perimeter; and (e) providing a conductive structure for sealing the via structure.

According to a further aspect of the invention, a method of forming a sealed via structure is provided. The method includes: (a) providing a semiconductor substrate having a first surface and a second surface opposite the first surface; (b) forming an insulating layer on the first surface of the substrate; (c) etching a via hole through the substrate from the second surface to the insulating layer; (d) forming an aperture in the layer; and (e) providing a metallization structure for sealing the via structure.

According to a further aspect of the invention, a sealed via structure is provided. The via structure includes: a semiconductor substrate having a first surface and a second surface opposite the first surface; a layer on the first surface of the substrate; a via hole through the substrate from the second surface to the layer, the via hole having a first perimeter in the first surface; an aperture in the layer, wherein the aperture has a second perimeter within the first perimeter; and a metallization structure sealing the via structure.

According to a further aspect of the invention, a sealed via structure is provided. The sealed via structure includes: a semiconductor substrate having a first surface and a second surface opposite the first surface; an insulating layer on the first surface of the substrate; a via hole through the substrate from the second surface to the layer; an aperture in the insulating layer; and a metallization structure sealing the via structure.

According to a further aspect of the invention, a method of detecting leakage in a sealed device package is provided. The method involves: (a) providing a sealed package containing a device, wherein the package is sealed under conditions providing a measurable deflection in a wall of the package, and wherein the extent of deflection is dependent on the pressure inside the package; and (b) measuring the deflection of the wall after sealing the package.

According to a further aspect of the invention, a sealed device package is provided. The package includes: a substrate; a lid including a semiconductor material over the substrate; a sealed volume between the substrate and the lid; and a device in the sealed volume. The sealed volume is at a pressure such that a wall of the lid has a measurable deflection, and wherein the extent of deflection is dependent on the sealed volume pressure.

According to a further aspect of the invention, a device package is provided. The device package includes a substrate having a first surface; a device mounted on the first surface of the substrate; a cavity in the substrate; and a cooling structure in the cavity for removing heat generated by the device.

According to a further aspect of the invention, a device package is provided. The device package includes: a substrate including a lid mounting region and a device mounting region; a lid on the lid mounting region to form an enclosed volume between the substrate and the lid; a device on the device mounting region in the enclosed volume; and a cooling structure in the cavity.

According to a further aspect of the invention, a method of bonding a first component to a second component is provided. The method involves: (a) providing a plurality of layers between the first and second components, the plurality of layers including a first constituent layer, a second constituent layer of a different composition from the first constituent layer, and a diffusion barrier layer, wherein the diffusion barrier layer is disposed between the first and second constituent layers and the second constituent layer is disposed between the first component and the diffusion barrier layer; (b) applying a pressure to the first component to form a bond between the first component and the second constituent layer; and (c) heating the bonded structure to a temperature and for a time effective to cause inter-diffusion of atoms between the first and second constituent layers. The resulting structure has an overall melting point greater than the heating temperature.

BRIEF DESCRIPTION OF THE DRAWINGS

The foregoing summary and the following detailed description of the exemplary embodiments of the present invention will be best understood when read in conjunction with the appended drawings, in which:

FIG. 5B schematically illustrates a perspective view of a micro optical device package in accordance with the present invention which is assembled from the components illustrated in FIG. 5A;

DETAILED DESCRIPTION OF THE INVENTION

Figure 1A:
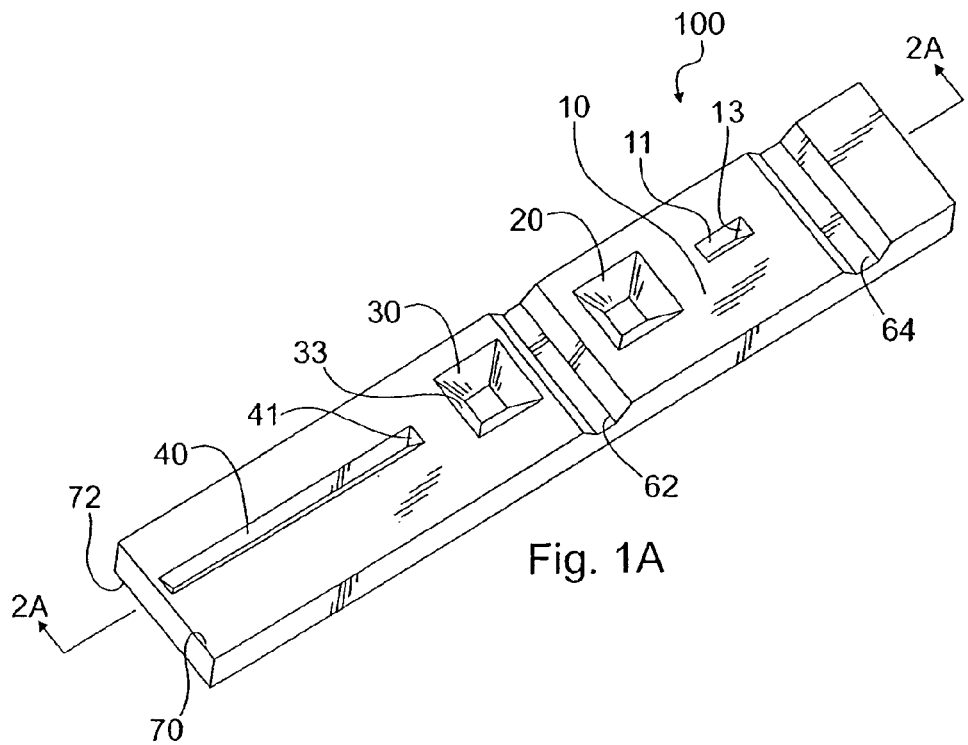
FIGS. 1A-1C schematically illustrate perspective views of an optical microbench in accordance with the present invention at various stages of fabrication.

Referring now to the figures, wherein like elements are numbered alike throughout, a micro-optical device package 500 in accordance with the present invention is provided. The micro-optical device package 500 has a configuration that facilitates hermetic sealing of a lid 200 to an optical microbench 100 by obviating the need for an optical passthrough opening in the lid 200. The lid 200 comprises a sidewall 220 that is sufficiently optically transparent to wavelengths of light to be received by or transmitted from an optoelectronic device 12, 18 disposed under the lid. As used herein, the term "light" is not limited to the visible spectrum, but includes electromagnetic radiation outside of the visible spectrum.

To further permit the unobstructed propagation of light through the sidewall 220 and through the remainder of the optical system, a sealing surface 226 of the lid 200 may be recessed into the optical microbench 100 so that the clear aperture of the optical system is not clipped by any surfaces of the optical microbench 100. In this regard, recessed clearance surfaces 50, 52, 54, can be provided. The use of such clearance surfaces 50, 52, 54 and the recessed lid mounting is useful for many micro-optical systems. In this respect, light generating sources, such as a laser die which may function as the optoelectronic device 12, are usually bonded active stripe side down onto the microbench 100 to allow the active stripe to be accurately located with respect to features on the microbench 100. Such placement leads to the optical axis being disposed close to the upper surface 70 of the microbench 100. Without recessing the lid 200, the optical beam may interfere with the lid bond line and the microbench 100. By recessing the lid (or lid wafer), into the microbench 100 (or microbench wafer) the full aperture of a beam can pass through the lid sidewall 220 and the remainder of the optical system on microbench 100 without unwanted loss of light due to occlusion of the beam. For example, up to half of the light generated by a light source may be lost without the recessed lid 200. In certain applications, however, it may be acceptable to mount the lid 200 to a non-recessed portion of the microbench 100.

A. Microbench
1. Layout of Micromachined Microbench Features

Figure 1B:
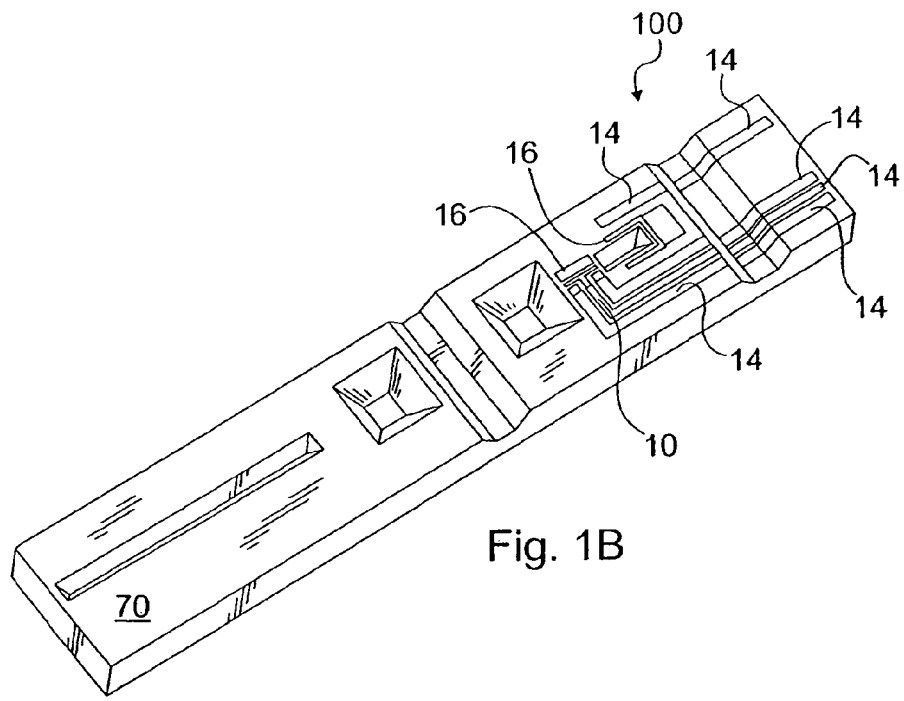
Figure 1C:
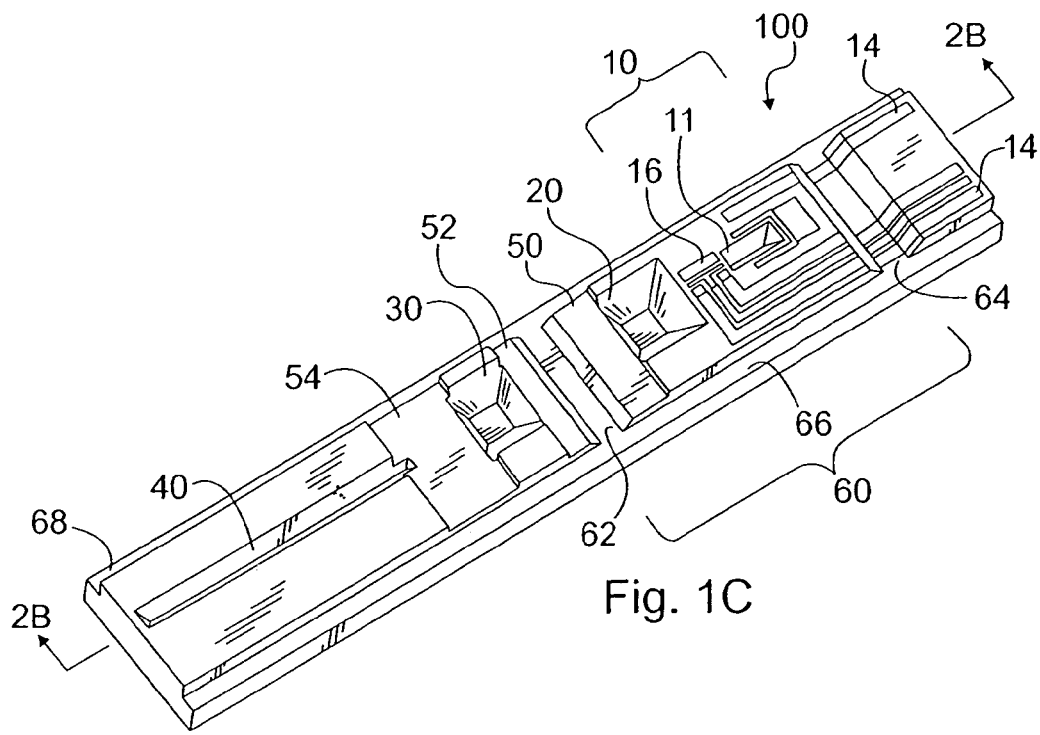
Figure 4A:
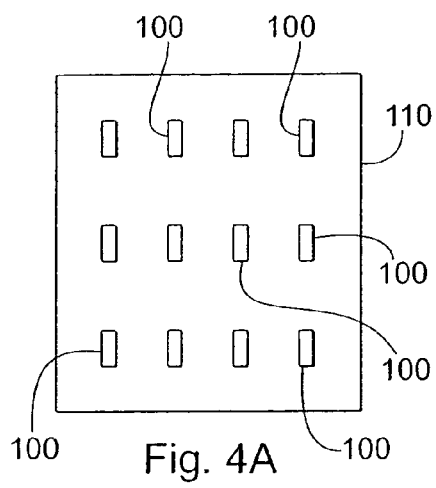
FIG. 4A schematically illustrates a top view of a base wafer comprising a plurality of optical microbenches in accordance with the present invention.

Referring now to FIGS. 1A-1C, 2A, and 2B, an exemplary optical microbench 100 for use as a base of a micro-optical device package 500 in accordance with the present invention is illustrated. While the microbench 100 is illustrated in FIGS. 1A-1C as a discrete component, the microbench 100 may be a portion of a base wafer (a grid) 110 or a complete base wafer 110 on which multiple optical microbenches 100 may be provided, as illustrated in FIG. 4A. The microbench substrate material is chosen with regard to the features to be fabricated in the microbench 100. For example, the microbench material may comprise thermally conductive micro-molded plastics and slip-cast ceramics which may be replicated from a master micromachined wafer. One particularly well suited material for the microbench 100 is single crystal silicon, which may be etched by an anisotropic process using established photolithographic techniques to provide for accurate orientation of components on the microbench 100. For purposes of illustration, and not limitation, the microbench 100 is described below as comprising a single crystalline material that can be anisotropically etched, though it is understood that other materials and processes capable of achieving the structure of the optical microbench 100 are contemplated by the present invention.

Figure 2A:
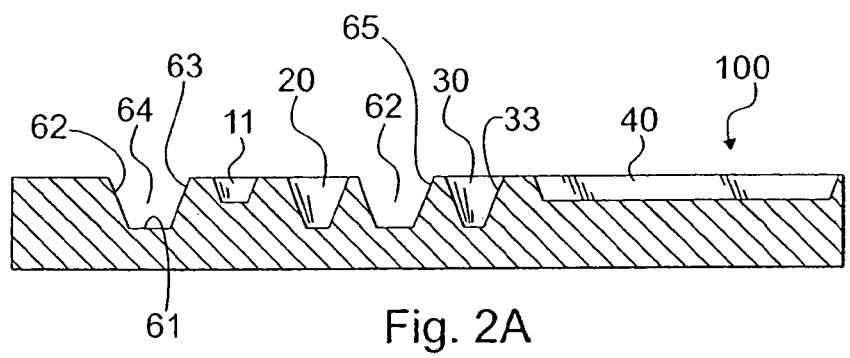
FIGS. 2A and 2B schematically illustrate side cross-sectional views of the microbenches of FIGS. 1A and 1C, respectively, taken along the respective sectioning lines 2A and 2B.

Turning now to FIGS. 1A and 2A, an exemplary microbench 100 is shown that includes an upper surface 70 into which one or more mounting features may be formed. The general layout of the mounting features that are to hold optical elements typically involves an optical model of the interaction of those optical elements. For example, first and second pits 20, 30, monitor groove 11, fiber groove 40, and front and rear lid mounting channels 62, 64 may be provided in the upper surface 70. As described more fully below, these features may be anisotropically etched into a (100) silicon substrate. To provide precision alignment among pits 20, 30, grooves 11, 40, and mounting channels 62, 64, such features may be formed during the same masking and etching process. The resulting etched structures each comprise inclined sidewalls that are {111} crystallographic planes. An un-etched portion of the upper surface 70 provides a device mounting region 10 onto which one or more optoelectronic, electronic, mechanical (e.g., MEMS) or optomechanical devices may be mounted, bonded, and electrically interconnected.

Figure 6A:
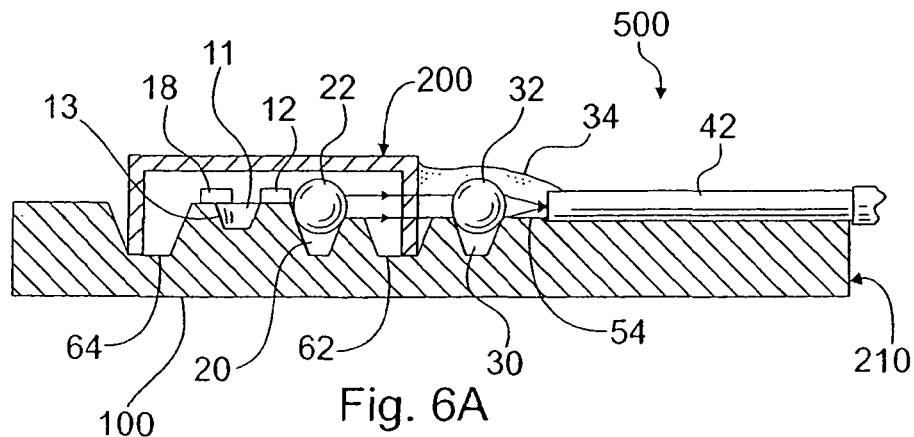
FIG. 6A schematically illustrates a side cross-sectional view taken along the optical axis of the micro-optical device package of FIG. 5A.

For example, in the case where the transparent lid 200 is placed in the optical path, as well as an optional optical isolator, two lenses 22, 32 may be used, the first lens 22 to semi-collimate the beam, allowing the beam to pass through the transparent lid 200 and the optional isolator, and the second lens 32 to couple the light into the optical fiber 42, as seen in FIGS. 5A, 5B, and 6A. While the device is being described such that the optical path is in a direction away from the optoelectronic device 12, it should be clear that the optical path may be in the reverse direction where the optoelectronic device receives the light. The spacing of the optical elements, and the corresponding mounting features used for their mechanical alignment should account for any encapsulants, solder pads, or other features that may ultimately affect their bonded locations or their optical performance.

Figure 6B:
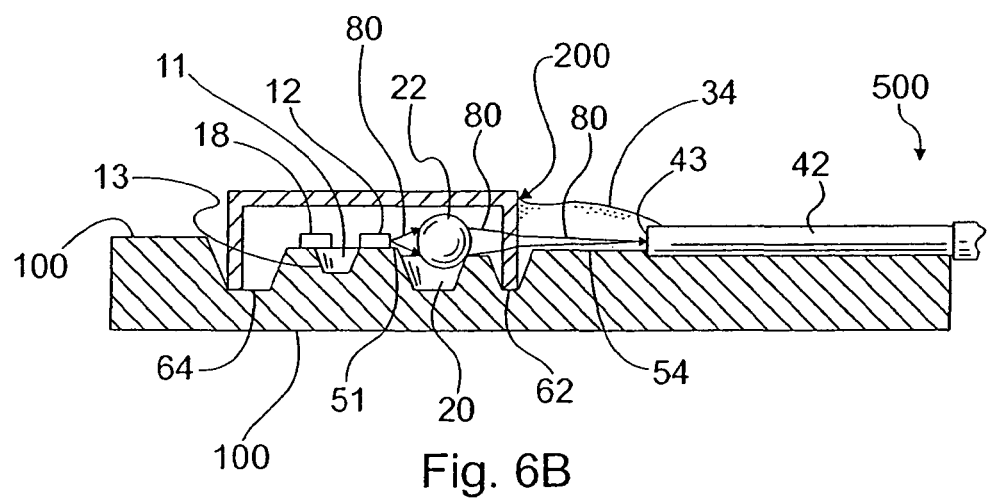
FIG. 6B schematically illustrates a side cross-sectional view taken along the optical axis of a micro-optical device package similar to that shown in FIG. 6A, but having a single lens that focuses the light emitting region of a laser onto the endface of a fiber.

The mounting features are typically made as small as possible to minimize the etch depth into the silicon, allowing tighter tolerances to be held. In one exemplary case, for a Fabrey-Perot (FP) or distributed feedback (DFB) laser die 12 mounted active region down onto the mounting region 10, the optical axis may be several microns above the upper surface 70 of the optical microbench 100. In this case the mounting element layout may be designed to place the centers of ball lenses 22, 32 (e.g., 500 microns diameter Spinel with Grade 10 or tighter tolerances) and the center of an optical fiber 42 at the height of the laser die 12 active region, as shown in FIGS. 6A and 6B. The ball lenses 22, 32, as well as other optical surfaces in the system, may be coated with an antireflection coating. For example, a silicon oxynitride ¼ wave layer deposited through LPCVD may provide a suitable conformal coating. The antireflection coating may be made, for example, using $N_2O$, $NH_3$ and $SiCl_2H_2$, with the gas flows and pressure adjusted to achieve the desired coating thickness and index uniformity.

Figure 7A:
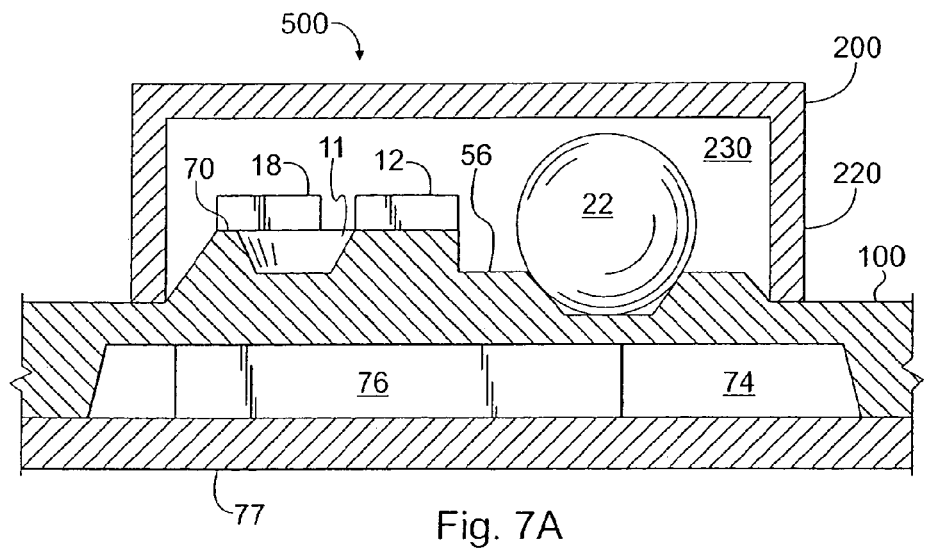
FIGS. 7A-7C schematically illustrate side cross-sectional views of micro-optical device packages in accordance with the present invention having various cooling structures.
Figure 7B:
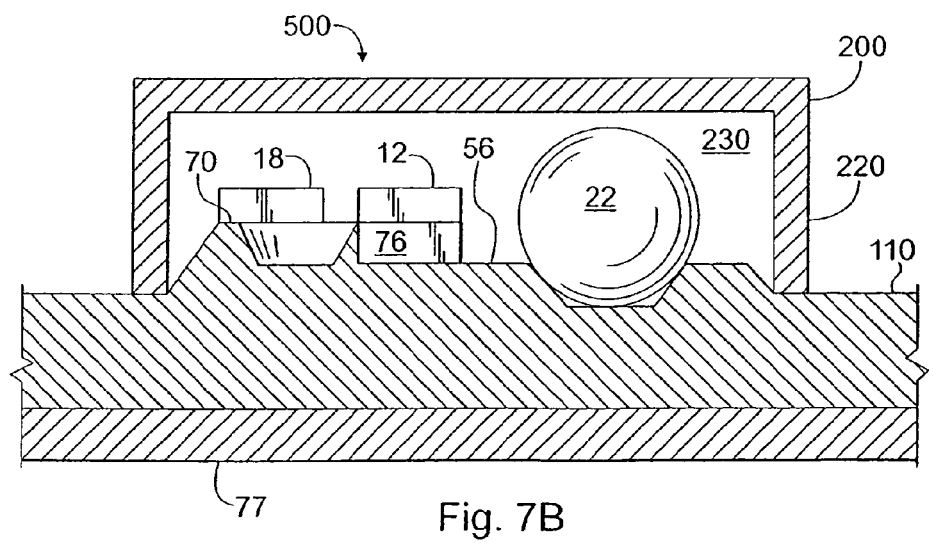
Figure 7C:
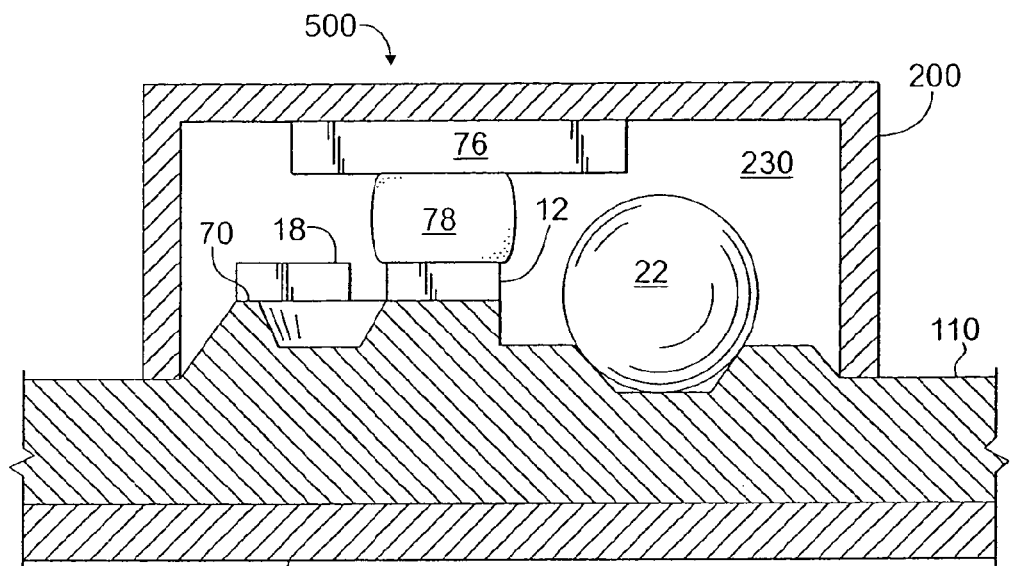

As optoelectronic devices tend to generate heat, it may in some cases be desirable to provide a cooling structure allowing for the removal of heat from the hermetic cavity. FIGS. 7A-C illustrate exemplary cooling structures which may be used. FIG. 7A, for example, illustrates a cooling cavity 74 in the microbench 100 below the location of the laser die 12. The cooling cavity may be formed, for example, by etching the base wafer using wet or dry etching (e.g. RIE etching) methods, typically to a depth of between 50 and 90% of the base wafer thickness. Provision in the cavity of a cooling structure 76 such as a miniature thermoelectric cooler (TEC or Peltier effect cooler) or a metal stud which may be connected to a TEC cooler can be made, allowing efficient, somewhat selective cooling (or temperature control) for the laser die region. This may be done both to reduce the power required for cooling and to control condensation. As shown, a heat sink 77 may be attached the base substrate to aid in heat transfer. FIGS. 7B and 7C illustrate further cooling configurations, in which cooling structures may be created within the hermetic cavity 230 directly on an upper or lower surface 70, 72 of the base wafer 110 (FIG. 7B) or in or on lid 200 (FIG. 7C) using microfabrication techniques. For improved thermal contact between the cooling structure 76 and optoelectronic device 12, a thermally conductive material 78, such as thermally conductive grease, may be employed.

With reference again to FIG. 1C, two longitudinal lid mounting channels 66, 68 may be provided at the periphery of the optical microbench 100 and extend along the length of the optical microbench 100. The longitudinal lid mounting channels 66, 68 intersect the front and rear lid mounting channels 62, 64 provide a lid mounting region 60 having the shape of a moat. Thus, the lid mounting region 60 may comprise a recessed perimeter that surrounds the device mounting region 10, the first pit 20, and the first recessed clearance surface 50 into which the lid 200 may be seated. As illustrated, the moat may be rectangularly-shaped. The depth of the longitudinal channels 66, 68 may be the same as the depth of the lid mounting channels 62, 64. If sub-surface sealing of the lid 200 is desired, the moat may be recessed into the optical microbench 100 below the upper surface 70 to a depth below the optical path of the micro optical system.

2. Microbench Conductive Pathway

To provide electrical connection to the optoelectronic devices 12, 18, electrical connections in the form of electrically conductive lead lines 14 may be patterned onto selected regions of the upper surface 70 of the microbench 100, as illustrated in FIG. 1B. The electrically conductive lead lines 14 may be oriented to permit electrical communication between the device mounting region 10 and a region of the microbench 100 exterior to the hermetically sealed lid 200 that covers and encloses the device mounting region 10, as illustrated in FIGS. 5A and 5B. For example, since a portion of the lid 200 seats in the rear lid mounting channel 64, the electrically conductive lead lines 14 may extend along the surfaces 61,63 of the rear lid mounting channel 64. Thus, electrical signals may be transmitted along the electrically conductive lead lines 14 under an edge of the lid 200 seated in the rear mounting channel 64. At selected locations along the electrically conductive leads 14, solder pads 16 may be provided such as at the terminal ends of the electrically conductive lead lines 14 in the device mounting region 10.

Figure 9A:
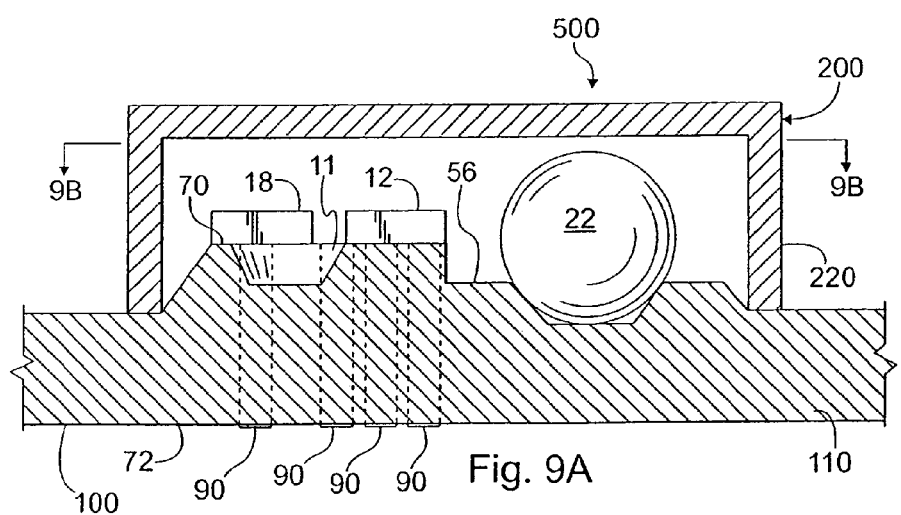
FIGS. 9A and 9B schematically illustrate a side cross-sectional view and a top view, respectively, of a micro-optical device package in accordance with the present invention having hermetic vias that extend from the interior of the hermetically sealed cavity to the exterior the package.
Figure 9B:
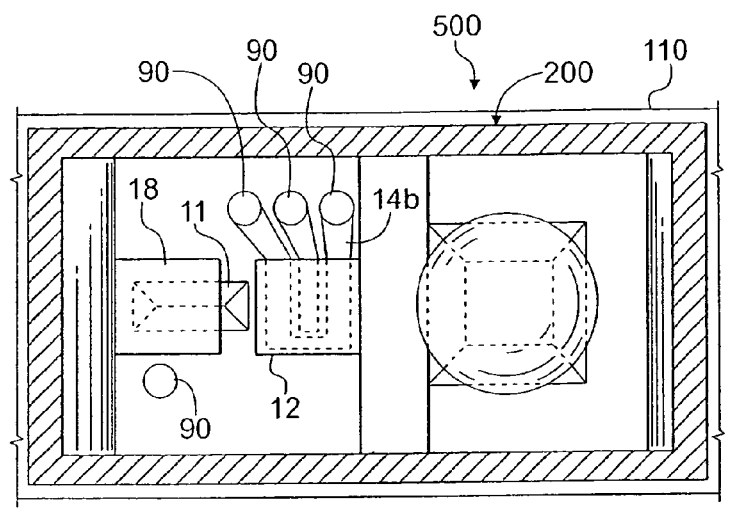

Alternatively or additionally, to provide electrical connection between devices 12, 18 in the device mounting region 10 and the exterior of hermetically sealed lid 200, one or more hermetically sealed conductive vias 90 may be provided, as shown, for example, in FIGS. 9A and 9B. The conductive vias 90 typically extend from the upper surface 70 of the device mounting region 10 through the microbench 100 to provide electrical communication with the lower surface 72 of the microbench 100. The conductive vias are beneficial in that electrically conductive lead lines 14 and sealing of the lid 200 over such lines is unnecessary. This is believed to result in improved electrical transmission characteristics, such as transmission speeds, when compared with lead lines that extend under the lid. Hermetically sealed conductive vias 90 may provide conductive pathways that are operable at high speeds, for example, from 10 to 60 GHz. In addition, use of conductive vias 90 allow for use of a metal solder, such as a Au—Sn eutectic (e.g., from 3 to 8 microns thick), to seal the lid 200 to the microbench 100 instead of a dielectric seal such as solder glass or a dielectric encapsulant layer which is typically used when sealing over the conductive lines 14. As a further benefit to the use of conductive vias, sloping sidewalls for the lead lines need not be employed in which case lid moats, if employed, can be simply created by dicing. The hermetically sealed conductive vias 90 may be provided by processes described herein below.

3. Microbench Optical Train

Returning to FIGS. 1A-1C, additional recessed features may be provided in the optical microbench 100 to provide clearance, if necessary, for passage of an optical beam through the optical system installed on the microbench 100. The recessed clearance surfaces 50, 52, 54 are provided at locations along the optical path to permit the optical beam to freely pass through the regions of the microbench 100 at the clearance surfaces 50, 52, 54 without the beam striking the optical microbench 100 in those regions. For example, as illustrated in FIG. 1C a first recessed clearance surface 50 is provided adjacent the first pit 20, a second recessed clearance surface 52 is provided adjacent the second pit 30, and a third recessed clearance surface 54 is provided between the second pit 30 and the fiber groove 40. The recessed clearance surfaces have a depth determined, at minimum, by the depth required to clear the optical beam, and at maximum, by the depth of the contact points between the etched features and the bonded optical elements within the etched features.

Referring now to FIGS. 4A-4E, 5A and 5B, the addition of optical and sealing elements to the optical microbench 100 is illustrated, wherein the final assembled micro-optical device package 500 is illustrated. The assembled micro-optical device package 500 comprises optical elements and optoelectronic devices mounted on the optical microbench 100 at the mounting features, for example, at first and second pits 20,30. As used herein, the term "optoelectronic devices" includes active devices that emit, detect, or otherwise alter an optical beam, including, for example optical sources, optical detectors, and MEMS devices. The term "optical elements" includes optoelectronic devices as well as passive optical elements, such as lenses, gratings, prisms, filters, and so forth.

Referring to FIG. 5A, an exploded view of an exemplary micro-optical device package 500 in accordance with the present invention is shown. The micro-optical device package 500 includes the optical microbench 100 and lid 200. An optoelectronic device 12, such as a semiconductor laser die, is provided on the device mounting region 10 in electrical communication with the solder pads 16. In addition, an optional back facet monitoring photodiode 18 is provided on the device mounting region to monitor the laser die 12. Like the laser die 12, the monitoring photodiode 18 is mounted in electrical contact with respective solder pads to permit electrical communication with respective conductive lead lines 14. Additional solder pads may be disposed on the surface for providing mechanical bonding and may be of the same or a different composition than those used for electrical connections. Various compositions may be used to make a compatible bonding hierarchy. These compositions may be split between the parts to be bonded and the microbench surface so that the solder alloy does not form or does not form completely until both parts are in contact with each other. This allows more freedom in the bonding hierarchy and can yield several melting and bonding temperatures for compositional variations around a given eutectic.

To permit passive, vision alignment of active devices, such as laser die 12, on the microbench, the active devices of the present invention may incorporate suitable fiducials. The fiducials may be defined at the same time as the active region of the laser die 12 to avoid lithographic offset, which in turn minimizes the bonding error. To aid in post bond inspection, the side of the die 12 directly opposite the die fiducials can be provided with no metal. This allows IR passive inspection of the alignment by viewing the alignment of the silicon bench fiducials relative to the laser die fiducials when viewing both through the microbench 100 and the laser material. The passive inspection methods, which typically use an intensity per quadrant based "weighted average" to determine the post bond accuracy, may be used on some precision bonders to improve their bonding accuracy. As well, they can provide an indication of the coupling efficiency that will be achieved before the laser die 12 is powered.

One can optionally create a DFB style die or an FP die with a grating yielding spectral linewidth of, for example, about 1 nm. This value is significantly wider than that used on typical DFB lasers, where the design allows for several (e.g., from 2 to 6) modes to be present but with a narrower linewidth than available in an FP alone. This method can extend the reach of the FP die and can allow the DFB style die to be used without isolators. This can be achieved by producing less spectral width than would normally be present in an equivalent FP laser as well as helping to reduce the thermal drift of the center wavelength by making it dependent on the dn/dt of the grating rather than simply the dn/dt of the gain curve. Finally, the benefits of using a "several mode" die over a single mode DFB include the removability of an isolator from the system for some extended reach (e.g., 1 to 20 kM applications). In this regard, a back reflection will not interfere all the modes to the same degree as it would in a single spectral mode laser (DFB). This allows the less expensive FP style die to be used for longer link lengths in uncooled operation which is desirable from a yield and cost perspective against the DFB and isolator.

If the optional back facet monitoring photodiode 18 is used, it is desirable to provide an optional clearance groove 11 disposed between semiconductor laser die 12 and monitoring photodiode 18. The clearance groove 11 provides clearance for light emitted by the laser die 12 to propagate downward into the clearance groove 11 before being reflected upward and reaching the photodiode 18. The clearance groove 11 may include an inclined endface 13 for receiving light emitted from the laser die 12 and reflecting such received light upward away from the optical microbench 100 and into the photodiode 18. The location of the monitor photodiode 18 is chosen so as to receive the thus deflected optical beam. The location of the monitor photodiode 18 may be adjusted away from the point of maximum coupling with the laser back facet if there is more light than desired to ensure the full scale of light is within the dynamic range of the monitor photodiode 18. The endface 13 may, for example, be metallized or otherwise coated to enhance its reflectivity. The optional clearance groove 11 may be formed during an anisotropic etching step for providing the first and second pits 20, 30. In such a case, the angled endface 13 may comprise a {111} plane in anisotropically etched (100) single crystal silicon.

The laser die 12 typically emits a generally conical-shaped beam of light 80 having upper and lower marginal rays that lie within a plane perpendicular to the upper surface 70 of the microbench 100 and containing the optical axis. An optical element, such as first ball lens 22, may be seated in the first pit 20 for receiving the cone of light 80 emitted by the laser die 12, as shown in FIG. 6A. Optionally, the first pit 20 may be larger than required to permit the first lens 22 to seat therein. For example, the first pit 20 may be longer along the direction of the optical axis so that the first lens 22 seats in the first pit 20 by contacting only three of the four sidewalls for the pit 20. In a similar manner the second pit 30 may be larger than the second lens 32.

The first ball lens 22 may be adhered to the pit 20 using a suitable adhesive or bonding agent, such as a solderglass or a solder that will wet the lens. Such solders may be deposited directly into the pit 20 by evaporation or sputtering through a shadow mask, or may be deposited by using solder balls, among other methods. To prevent obscuration of the lower marginal ray emitted from the laser die 12, the light emitting edge of the laser die 12 may desirably be placed adjacent to the pit 20, so that the lower marginal ray propagates downward into the pit 20 to intercept the first lens 22 without striking any portion of the optical microbench 100. Alternatively, the laser die 12 may be spaced apart from the ball lens 22 and a recessed clearance surface 56 may be provided to permit the lower marginal ray to reach the ball lens 22 unobstructed, as illustrated in FIG. 9A. The optical properties of the first lens 22 may be desirably selected with the focal point of the lens located at the light emitting region of the laser die 12, so that the first lens 22 collimates the cone of light 80 received from the laser die 12 to a desired degree, as shown in FIG. 6A. Alternatively; the optical properties of the first lens 22 may be selected to provide a converging beam that propagates along the optical axis towards the fiber groove 40, as shown in FIG. 6B.

4. Hermetically Sealed Cavity

The micro-optical device package 500 also includes a lid 200 for seating on the microbench 100 to a lid mounting region, for example, in the lid mounting channels 62, 64, 66, 68 if present, to provide a sealed enclosure about the laser die 12, first lens 22, photodiode 18, and first recessed clearance surface 50. The lid 200 may, for example, include four sidewalls 220 and a roof 250 to provide a rectangularly shaped cavity 230 within the lid 200. In other exemplary embodiments, the lid 200 may comprise a single arcuate sidewall or may include a lid sidewall having a lenticular shape to provide optical power. The roof 250 of the lid 200 typically has a thickness ranging from 10 to 100 microns. The ratio of the thickness of the roof 250 to the longest dimension (span) of the cavity 230 is typically $\frac{1}{10}$ to $\frac{1}{50}$. Such a ratio permits the roof 250 to bend sufficiently in response to a change or loss in hermeticity. Such bending may be measured to provide an indication of hermeticity of the package. For example, for a lid 200 having a cavity span of 1 mm, a 40 micron lid thickness can generally provide adequate deflection and durability. The lid cavity depth is typically determined by the depth of the recessed trench (if present) and the height of components it encases. A typical lid depth is, for example, from 100 to 600 microns.

The inclined sidewalls 65, 63 of the front and rear lid mounting channels 62, 64 may assist in guiding the respective sidewalls 220 of the lid 200 to seat at a desired location within the lid mounting channels 62, 64. The depth of the lid mounting channels 62, 64, 66, 68, as well as the width of the front and rear lid mounting channels 62, 64, may desirably be selected to permit a lower sealing surface 226 of the lid 200 to be attached to the optical microbench 100 at a sufficient depth so that sealing surface 226 lies outside of the optical path of the optical system. Thus, the width of the front and rear lid mounting channels 62, 64 may be equal to, larger than, or less than the width of the sidewalls 220 seated therein, so long as the lower sealing surface 226 lies outside of the optical path. In addition, the lid 200 may be sealed to the optical microbench 100 so that the lid sidewall 221 that intersects the optical axis is disposed slightly off perpendicular with respect to the optical axis by an amount sufficient to prevent back reflections into the laser die 12, for example, by one or two degrees. Back reflections allowed into the laser die 12 might detrimentally interfere with the optical performance of some devices, such as DFB lasers.

The lid 200 is typically configured so that at least a portion of sidewall 221 that lies within the optical path is optically transparent to the wavelength of light transmitted by the laser die 12. This permits an optical signal to travel between the laser die 12 and the exterior of the lid 200 with minimal loss. In some instances, it may be desirable that the sidewall portion comprises an optical waveguide. The transparent sidewall portion should have physical characteristics compatible with transmitting a beam of light therethrough. For example, the thickness, parallelism, and smoothness of the sidewall surfaces through which the beam passes should provide acceptable optical performance and should not unacceptably degrade the beam. As an example, the lid sidewalls 220 may comprise silicon and may have a thickness of 10-100 microns. To minimize the sensitivity of the optical beam to variations in thickness or surface roughness, it may be desirable to pass a nearly collimated beam through the sidewall portion of the lid 200. For this reason, it may be desirable to provide the above-mentioned collimating function of the first lens 22. In addition, the sidewall portion may be coated with an antireflection coating, such as silicon nitride, that is ¼ wavelength thick to reduce reflection.

The lid 200 can be hermetically sealed to the lid mounting region of the microbench 100 by any suitable bonding material 240 such as a solder glass or metal solder. Conveniently, the bonding material 240 may be applied first to the lid sealing surface 226. Alternatively, the lid 200 may be hermetically sealed directly to the microbench 100 directly using welding or other technologies. Suitable bonding materials include, for example, solder glasses such as those containing one or more of $SnF_2$, SnO, $PO_{2.5}$, $PbF_2$, $NbO_{2.5}$, $ZnF_2$, and $BaF_2$, and those available from Diemat, Inc., Byfield, Mass., USA, such as DM2700 PF solder glass, and metal solders, for example, eutectic or near eutectic Au—Sn on an underlayer, for example, Cr/Ni.

If conductive lead lines 14 are provided along the upper surface of the microbench 100, a conductive bonding material 240 such as metal solder should not be allowed to electrically communicate with the lead lines 14. In this instance, a dielectric may be placed between the conductive lead lines 14 and conductive bonding material. Such a configuration, however, might result in degradation in the speed at which signals can travel through the conductive lead lines 14 due to capacitive effects. Accordingly, a dielectric bonding material such as epoxy or glass solder may be used for hermetically sealing the lid 200 over the lead lines 14. However, even glass solder may be unsuitable for high RF transmission applications, in which case hermetically sealed conductive vias 90 may be preferable. To minimize the effect of the seal on the conductive lead lines 14, at least the lid sidewall 220 portion disposed over the lead lines 14 may be made thin.

A second optical element, such as ball lens 32, may be provided in the second pit 30 for receiving the collimated beam from the first lens 22 which is passed through the sidewall 221 of the lid 200, as shown in FIGS. 5B and 6A. The second ball lens 32 may be adhered to the pit 30 using a suitable adhesive or bonding agent. After separation, the optical fiber 42 may be seated in the fiber groove 40 and adhered with a suitable adhesive or bonding agent. The fiber groove 40 has a depth sufficient to permit the optical fiber segment 42 to lie along the optical axis. The optical fiber 42 may be disposed in a ceramic ferrule 44 that extends beyond the length of the optical microbench 100 to provide mechanical support of the fiber 42 and to assist in coupling the optical fiber 42 to other optical components. Alternatively, a ceramic split sleeve or plastic receptacle may be bonded in place of a fiber as part of a fiber optic receptacle design. This allows for accurate registration of an external fiber optic connector which can then be plugged into the receptacle to make reproducible optical coupling with the device package 500.

The optical properties of the second lens 32 may be beneficially selected with the focal point of the lens located at a proximate endface 43 of the fiber 42. In this way, the second lens 32 focuses the collimated beam onto the fiber endface 43 to effectively couple the light emitted from the laser die 12 into the fiber 42. To protect the optical system from effects of contaminants, such as dust, an encapsulant 34 may be provided over the fiber endface 43 and the second lens 32, and may also fill the void along the optical path between the second lens 32 and the proximate sidewall 221 of the lid 200, as shown in FIGS. 5A and 5B. The optical properties of the encapsulant 34 and the second lens 32 are selected so that the desired focusing of the beam onto the fiber endface 43 occurs. Commercially available materials may be used and include, for example, silicone encapsulants, index matching epoxies, SmartGel™ encapsulant available from Nye Optical Products, Inc., Fairhaven, Mass., USA, and other encapsulants available from Dow Corning.

Figure 8A:
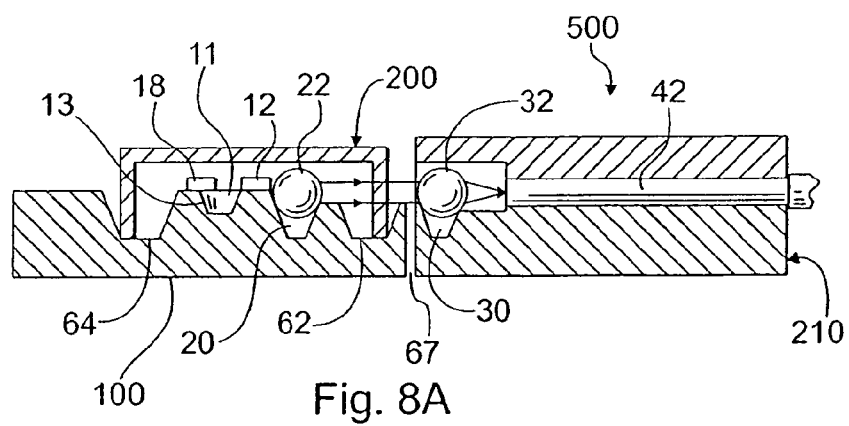
FIGS. 8A and 8B schematically illustrate side cross-sectional views of further a micro-optical device packages in accordance with the present invention.

In addition to the exemplary micro-optical device packages 500 illustrated in FIGS. 1-6, other configurations of micro-optical device packages in accordance with the present invention are possible. For example, micro-optical device package 500 may receive an optical beam through a first sidewall 220, have the beam optically altered by an optical element in the device package 500, and then have the altered beam transmitted out of the package 500 through one or more of the same sidewall 220, a different sidewall 200, or the lid roof 250. Further, a series of device packages 500 of the same or different configuration may be daisy-chained together to provide an optical train of device packages 500. Still further, with reference to FIGS. 8A and 8B, the micro-optical device packages 500 may be provided that do not include one or more optical fiber segment 42 and second ball lens 32. Instead, the micro-optical device packages 500 may be configured for attachment to a fiber ferrule 210a, 210b that may optionally include the spherical lens 32 in the ferrule. Optionally, the gap 67 between the device package 500 may include a bonding material to fixedly mount the ferrule 210 to the device package 500. Further, an index matching material may be disposed in the gap 67.

B. Connectorization

Figure 10A:
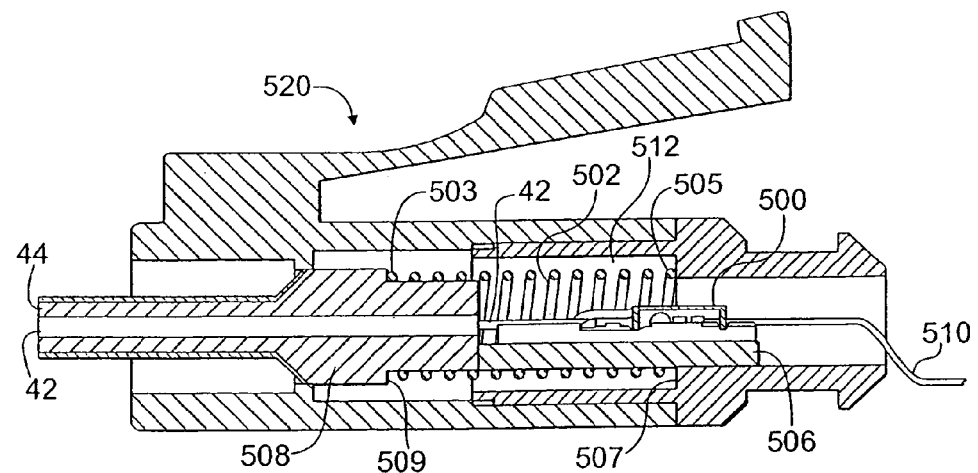
FIGS. 10A and 10B schematically illustrate a side cross-sectional view and a perspective view, respectively, of a connector in which a micro-optical device package in accordance with the present invention is housed.
Figure 10B:
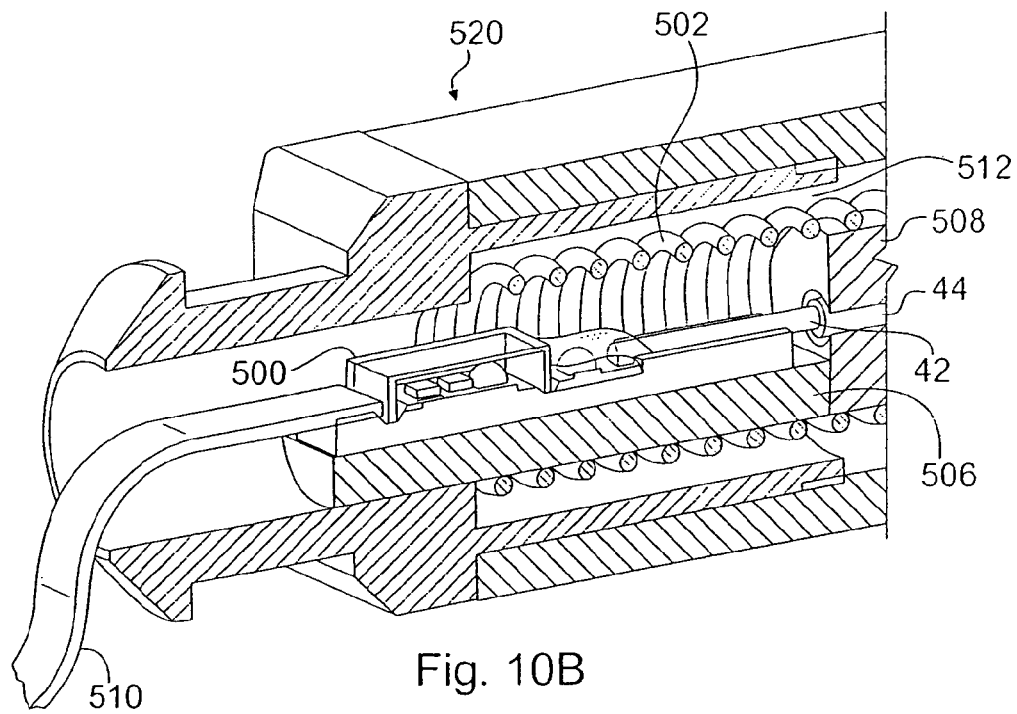

The micro-optical device package 500 may be used in a variety of optoelectronic system configurations, such as mounted to or on an electronic device substrate such as a printed wire board (PWB) or as part of a connectorized device. For example, as illustrated in FIGS. 10A and 10B, a connector 520 may be provided for receiving a micro-optical device package 500 in accordance with the present invention to permit the micro-optical device package 500 to be optically connected to other system components. Owing to the small size achievable in micro-optical device packages of the present invention, the micro-optical device package 500 may be housed within an interior cavity 512 of the connector 520. Moreover, micro-optical device packages of the present invention are well-suited for inclusion in connectors that are presently commercially available. For example, the connector 520 may be an LC connector or other suitable connector. Hence, a connector comprising an optical microbench of the present invention permits a fiber optic connector to function as an optical transmitter, receiver, or transceiver.

The micro-optical device package 500 may be mounted on a housing mount 506 using a suitable bonding material. The housing mount 506 may be designed to provide both mechanical support and heat dissipation. A ferrule housing 508 may be provided in the connector 520 for receiving and supporting the ferrule 44 containing the fiber segment 42 that is optically attached to micro-optical package device 500. The ferrule housing 508 is attached to the housing mount 506 using a suitable bonding material. Alternatively, the housing mount 506 and the ferrule housing 508 may be formed of a single monolithic part. Desirably, the ferrule housing 508 and housing mount 506 may comprise a metal. The ferrule 44 of the micro-optical device package 500 may conveniently have a length that permits the terminal end of the fiber ferrule 44 to coincide with the terminal end of the ferrule housing 508. The ferrule housing 508 may be swaged onto the fiber ferrule 44.

Electrical signals and power may be supplied to the micro-optical device package 500 by a flex circuit 510 which is electrically connected to the conductive lead lines and/or to the vias, depending on whether conductive lead lines or vias are used. The flex circuit 510 may be made, for example, of copper plated on polyimide such as that produced by 3M. The flex circuit 510 allows the device package 500 to be mechanically coupled to and decoupled from an electronic device substrate such as a PWB which may be desirable to prevent CTE differences from causing bonding failure. Flex circuit 510 can adjust for pitch difference between the PWB and the device package contact pads, may include solder on its ends, may include a terminating resistor along its length, and contains controlled impedance transmission lines to properly carry the RF signals between the PWB and the device package 500.

The ferrule housing 508 may be slidably mounted within the connector 520 to permit the ferrule housing 508 to piston within the connector 520. In this regard, the connector 520 may include a ferrule spring 502, such as a helical spring, disposed over a portion of the ferrule housing 508 and within the connector cavity 512. The front end 503 of the ferrule spring 502 rests against a shoulder 509 of the ferrule housing 508, and the rear end 505 of the ferrule spring 502 rests against a shoulder 507 of the connector cavity 512. Alternatively, micro-optical device package 500 may be fixedly mounted within the connector 520 without the ability to piston.

Figure 11A:
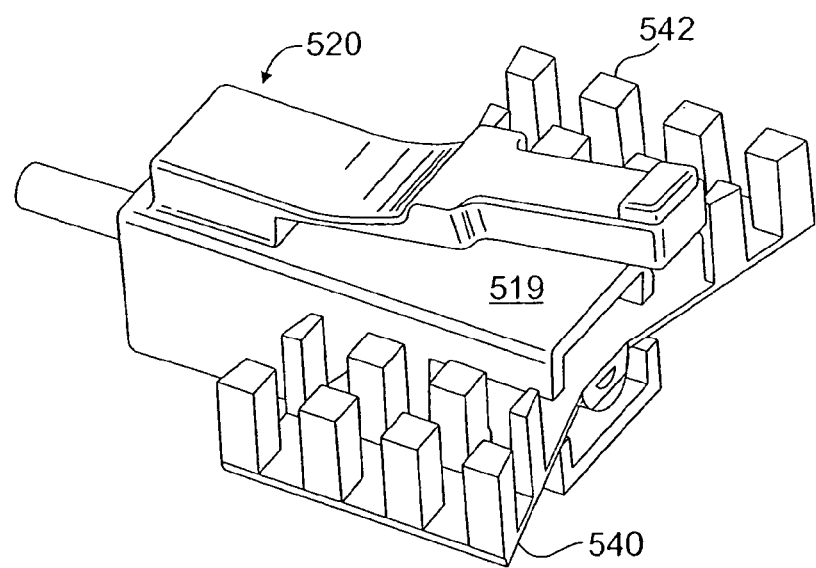
FIGS. 11A-11C schematically illustrate perspective views of connectors for housing a micro-optical device package of the present invention along with heat sinks for cooling the micro-optical device package.
Figure 11B:
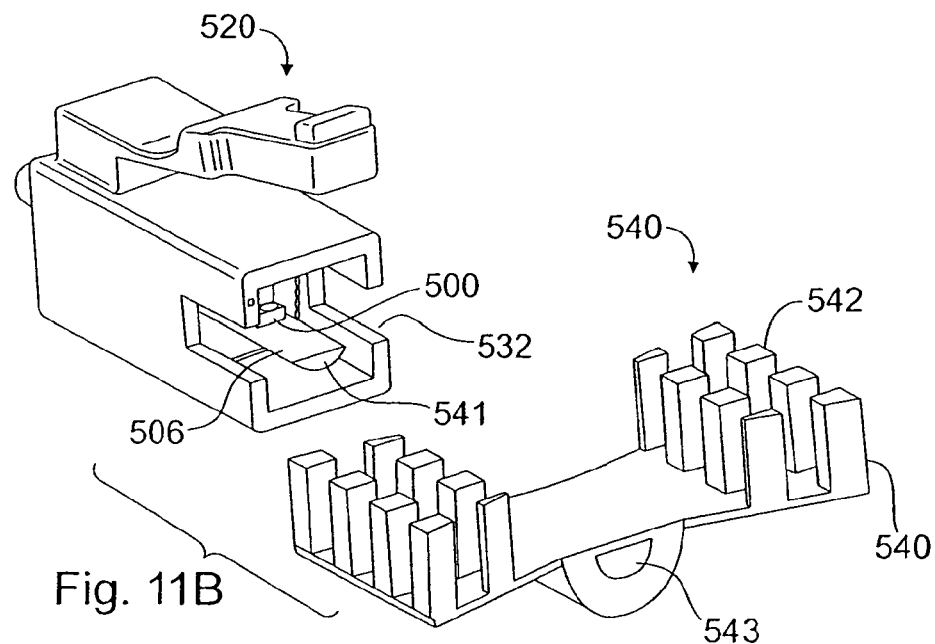
Figure 11C:
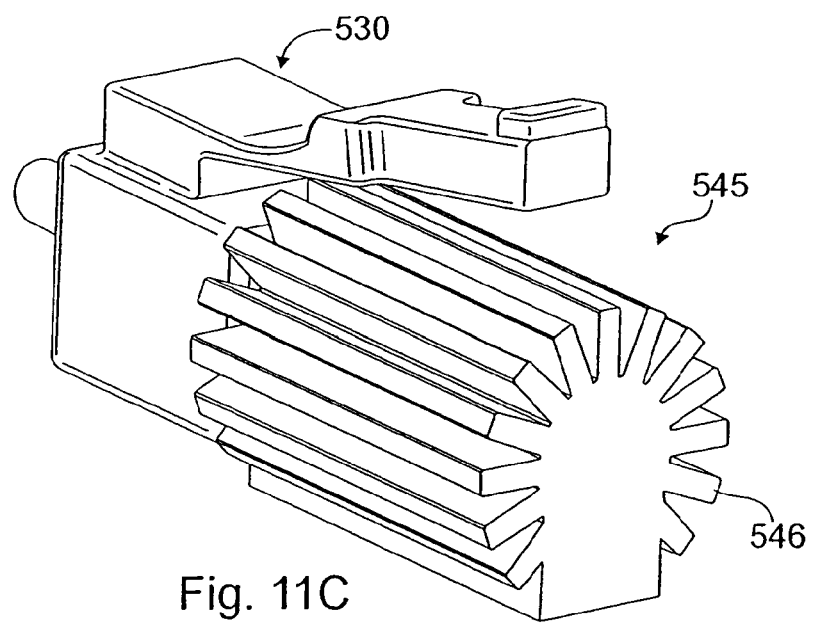

To assist in cooling of the micro-optical device package 500, a connector 520 may be provided with a heat sink 540, 545, as illustrated in FIGS. 11A-11C. The connector 530, including its internal components, may be substantially similar to the connector 520. However, to accommodate the exemplary heat sink 540, 545, it may be desirable to modify the housing of the connector 520, to provide slotways 532 in the housing of the connector to permit the heat sink 540, 545 to extend beyond the confines of the cavity of the connector. As shown in FIG. 11B, the heat sink 540 may include a passageway 543 having a cross-sectional shape similar to the cross-sectional shape of the proximal end 541 of the metal ferrule housing to permit the heat sink to be slidably mounted onto the proximal end 541 of the metal ferrule housing so that the heat sink is in thermal communication with the metal ferrule connector 508 which in turn is in thermal communication with the micro-optical device package 500. The heat sink 545 may be similarly connected to the metal ferrule housing 508. The heat sinks 540, 545 may desirably include a plurality of fins 542, 546 for assisting in the dissipation of heat from the heat sink. The heat sinks typically comprise a material having sufficient thermal conductivity such as a metal. In addition the back of the connector housing 519 may be made of a thermally conductive plastic to aid in heat transfer in and out of the connector or receptacle housing. Suitable plastics are commercially available, for example, Cool Poly™, available from Cool Polymers, of Warwick, R.I., USA. When mounted to a PWB, a heat sink may also be provided at the PWB to dissipate heat from the device package 500.

C. Microbench Fabrication

1. Microbench with Conductive Lead Lines

Figure 12A:
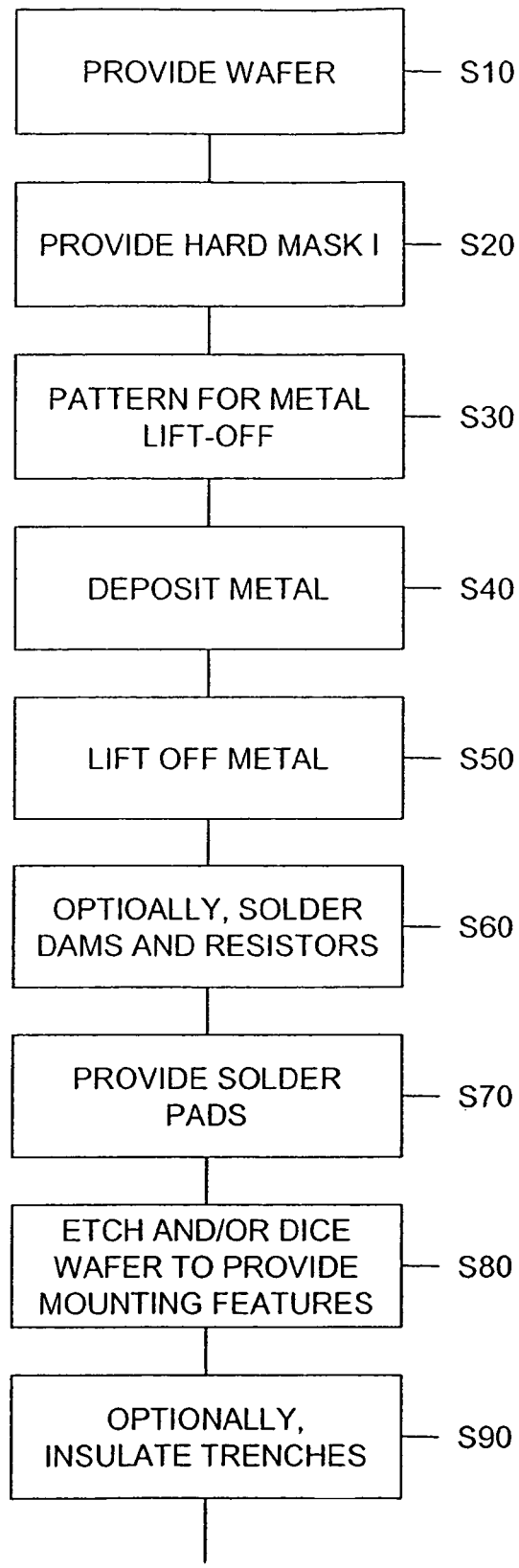
FIGS. 12A and 12B illustrate a flowchart representing a process in accordance with the present invention for fabricating an optical microbench having conductive lead lines.
Figure 12B:
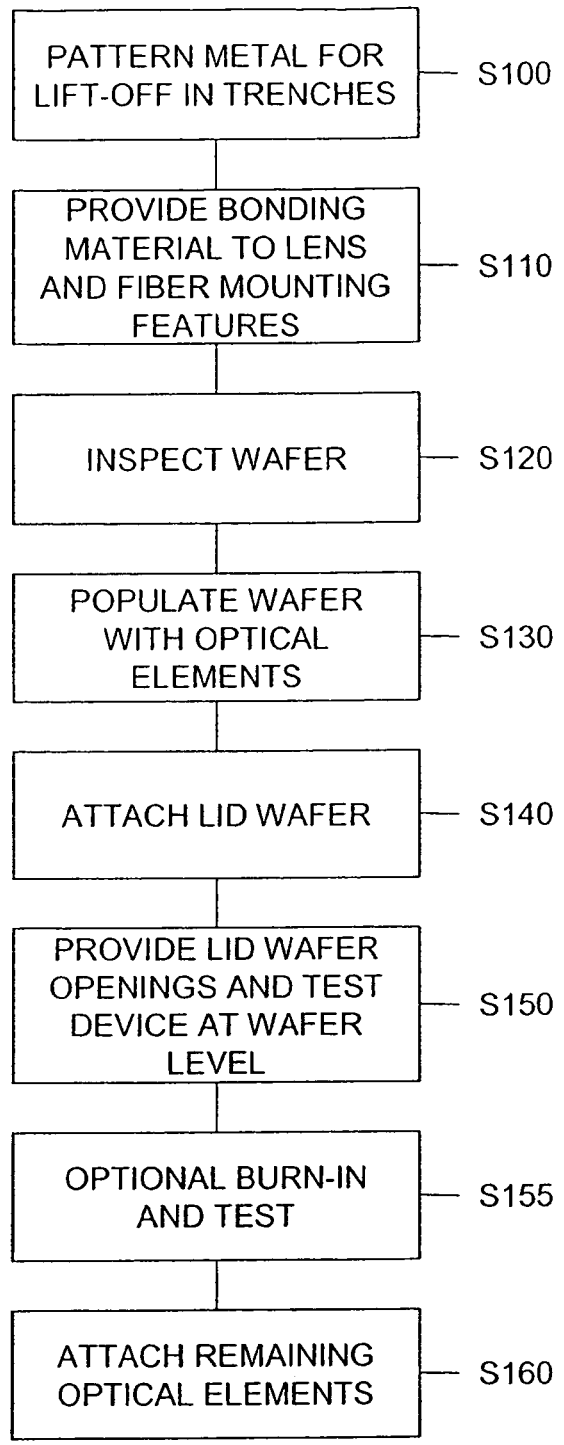

Referring to FIGS. 12A and 12B, a flowchart of an exemplary process for fabricating an optical microbench 100 having conductive lead lines 14 in accordance with the present invention is provided. While the flowchart and processes are described by way of example with regard to making a single optical microbench 100 on a base wafer 110, it should be understood that in practice it is desirable to fabricate a plurality of optical microbenches 100 on a single base wafer 110 or grid removed from a wafer.

Beginning at step S10, a base wafer 110, such as a (100) double-sided polished silicon wafer is provided. Typically, the thickness of the base wafer 110 is 525 microns thick, and the resistivity may desirably be greater than 1000 ohm-cm for high frequency applications. The base wafer 110 may desirably be selected to have the lowest oxygen concentrations and defect densities that are practically available to minimize defects in the micromachining process.

A first hard mask is provided on the base wafer 110, at step S20. The hard mask may comprise, for example, a silicon nitride layer such as a low stress silicon nitride layer. A suitable thickness of the first hard mask layer is, for example, 200 to 250 nm. Optionally, a crystal alignment step may be preformed to determine the precise axis of crystallographic alignment so that the features to be etched can be aligned to the crystal axis to the required degree of precision.

As provided at step S30, the base wafer 110 is patterned for metal lift-off. Optionally, the patterning for metal lift-off may utilize a lift-off resist layer disposed under a thicker resist patterned so that the thin lift-off resist may be undercut during subsequent processing. An optional re-entrant resist profile may be use to achieve clean lift-off when patterning the metal.

The process continues at step S40 with the deposition of one or more metal layers onto areas of base wafer 110 exposed through the patterned hard mask. This can be conducted by physical vapor deposition (PVD), for example, sputtering or evaporation, chemical vapor deposition (CVD), or other suitable processes. The metal layers may include, for example, one or more of an adhesion layer (such as Ti, TiW, TiN, Cr, NiCr, W, or other suitable material), a diffusion barrier layer (such as Ni, Pt, or other suitable material), and a surface metal (such as Au, Al or other suitable material). A typical thickness (when present) for an adhesion layer is 5 to 100 nm, for example 40 to 60 nm, such as 50 nm, for a diffusion barrier is 100 to 300 nm, for example, from 200 to 275 nm, such as 250 nm, for a surface metal is 200 nm to 1 micron, for example, from 500 nm to 1 micron. The metals should be chosen so that they are compatible with subsequent processing such as wet etching, soldering, and thermal processing. One may utilize, for example, a stacked layer of Ti/Pt/Au, TiW/Au, TiN/Au, Cr/Ni/Au, or NiCr/Ni/Au. It may be useful to utilize a diffusion barrier or adhesion layer thickness that can also allow the conductive lead lines 14 and solder pads 16 to incorporate the functionality of both resistors and/or solder dams, as desired, whereby the surface metal may be stripped back selectively for sections of the conductive lead lines 14. Solder dams may be put directly outside of a solder pad to prevent solder from wicking along the conductive (surface metal) lead lines 14 during reflow. Resistors are often desirable to allow transmission line terminating resistors to match the laser die 12 to the impedance required by the driver, e.g., 25 or 50 ohms. Gaps in the metallization and bonding of surface mount discrete elements can take the place of integrated elements when desired.

The patterned lift-off metal portions may be lifted off to create a first set of surface metallizations, e.g., the conductive lead lines 14 on upper surface 70 of the base wafer 110 and alignment fiducials, at step S50. Metal "rings" or traces of the shapes desired for subsequent silicon micromachining may also be provided for self alignment of the mounting features to be etched on the upper surface 70 of the base wafer 110 using another coating of resist and dry etch patterning through the hard mask (silicon nitride) as provided, for example, in co-pending U.S. patent application Ser. No. 09/519,165 entitled "Single Mask Lithographic Process for Patterning Multiple Types of Surface Features", filed Mar. 6, 2000, the contents of which are incorporated herein by reference. Alternatively, the metallizations for the conductive lead lines 14 and for the metal rings may be performed as separate steps. Additionally, the more conventional process of applying metallizations for the conductive lead lines 14 and the general resist patterning and dry etching of the hard mask may be utilized.

At step S50, the metal mask to define the mounting features, such as pits 20, 30 for lenses 22, 32, front and rear lid mounting channels 62, 64, monitor groove 11, fiber groove 40, and laser and back facet monitor alignment fiducials, may also be patterned. The patterning process to make the micromachined features comprises creating metal rings, typically 5 to 20 microns, that circumscribe those areas to be micromachined. Thus the metallization for the transmission lines, metal alignment fiducials and the areas to be micromachined can often be accomplished in one lithographic step. A second lithographic step, of less precision can then be performed that leaves openings in a resist layer over these metal rings. This allows the interior edge of the metal rings to act as a precision hard mask for a plasma etch step which will remove the silicon nitride or silicon oxide from the ring interior. After stripping the resist, the wafers can have their silicon anisotropically etched. Variations on the masking materials may be used depending on the particular etch chemistry type of etch performed. The patterning process to make the micromachined features involves removing the nitride hard mask from the interiors of the metal rings. The interiors are those areas to be micromachined by etching, which may be performed by dry etching in a $CF_4$ or other fluorine containing plasma. Details of these techniques are provided in the above-referenced U.S. patent application Ser. No. 09/519,165.

Optionally, if resistors or solder dams are desired, the surface metal layer may be selectively stripped using an additional lithography step and wet etching in a solution, for example, an iodine or potassium iodide solution. In some cases, where higher resistivity per area is desired, it may be desirable to strip back the diffusion barrier layer and utilize the adhesion layer, such as Cr, NiCr, W, TiW, TiN or Ti. The resist may be, for example, a spin-coated or electrophoretic resist. Electrophoretic resists are commercially available from Shipley Company, L.L.C., Marlborough, Mass., USA. As an alternative to using a lift-off process, steps S40 to S60 could also be accomplished by first placing the metal down, applying resist, and wet etching or dry etching the metal away to create the patterns.

Solder pads 16 which may be formed from, for example, roughly 80-20 Au—Sn solder, or other suitable solder, may be deposited using the same lift-off process as disclosed above, at step S70. The solder pads 16 may be made slightly tin rich to allow longer reflow times. Typical thicknesses are, for example, from 2.5 to 3.5 microns. The solder pad composition is typically designed to account for the ultimate inclusion in the composition of the metal, e.g., gold, in the base metallization and on the laser and monitor dies 12, 18 that are to be bonded.

To provide the mounting features, a micromachining step, such as an anisotropic wet etch may be conducted. Suitable etchants include, for example, ethylene diamine pyrocatechol (EDP), tetramethyl ammonium hydroxide (TMAH), hydrazine, or hydroxides of alkaline metals, for example, sodium hydroxide, potassium hydroxide, cesium hydroxide, or rubidium hydroxide, and the like. The etchant will depend, for example, on the specific selectivity to crystal planes, the choice of hard mask material, uniformity, surface roughness, protection of metals on the surface, and other design/fabrication considerations.

Figure 3A:
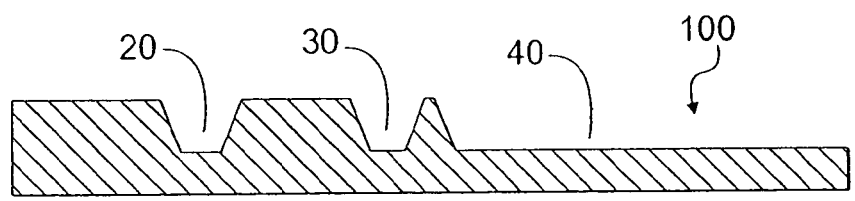
FIGS. 3A and 3B schematically illustrate side cross-sectional views of additional configurations of microbenches in accordance with present invention having a different arrangement of recessed areas than those illustrated in FIGS. 1A-C.
Figure 3B:
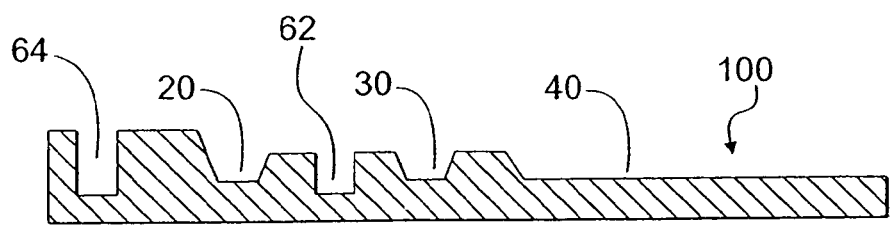

In step S80, formation of the recessed clearance surfaces 50, 52, 54 by mechanical methods, such as sawing, may be performed. Sawing may be desirable over etching in certain instances. Etching may attack adjacent anisotropically etched mounting features, such as first pit 20, potentially altering the precisely located boundaries of the anisotropically etched mounting feature(s). Such subsequent etching of the anisotropically etched mounting features may alter the relative location between optical opponents disposed in the anisotropically etched mounting features. The use of mechanical methods prevents the need for compensation features to be designed to protect the exposed exterior corners of each etched mounting element, and still provides {111} sidewalls on the etched mounting features. The front and rear lid mounting channels 62, 64 may also be provided by dicing, as illustrated in FIG. 3B, instead of by etching. In this regard, the front and rear lid mounting channels 62, 64 may be made subsequent to the etching operation.

A passivation step, step S90, may be desired, for example, if electrical isolation is desired between conductive lead lines 14 and the resistivity of the base wafer 110 does not provide adequate electrical isolation. For example, a PECVD silicon oxide, silicon nitride or silicon oxynitride may be deposited as a passivation coating in the rear mounting channel 64. The passivation coating typically requires another lithography step using, for example, spin coating or plated resist, followed by dry etching or wet etching, for example, a buffered oxide etch (BOE) to open the contact and solder pad surfaces. The thickness of this layer is typically from 50 to 250 nm or as desired to provide pin-hole free coverage.

To provide the conductive lead line portions that are disposed within the rear mounting channel 64, an additional series of metal patterning steps may be performed, which may be similar to steps S30-S50. Beginning at step S100, metal may be patterned for lift-off in the rear mounting channel 64 using conformal resist techniques. The same metallization structures discussed above may be utilized. To achieve proper metallization, the inclined surfaces, e.g., rear mounting channel surfaces 61, 63 should be located relative to the evaporant angle such that both rear mounting channel surfaces 61, 63 receive adequate coverage. Alternatively, a shadow mask may be used to pattern the conductive lead lines 14 disposed on the rear mounting channel surfaces 61, 63. A conformal shadow mask made from another etched wafer using wet etching to conform to the rear mounting channel 64 and dry etching to define conductive lead lines and electrical traces in the rear mounting channel 64 can be used.

Step S100 may be preceded by a dry etch, for example, a reactive ion etch using fluorine at 50 to 250 mTorr. This allows for removal of a nitride shelf that may be present and extend from the upper surface 70 and overhang the rear lid mounting channel 64 without completely stripping the masking layer on the surface. Use of a relatively high pressure during etching allows the shelf to be attacked from both sides by active ions creating a higher net etch rate than occurs on the surface. Removal of the shelf prevents shadowing effects on the metal below the shelf, such as electrical discontinuity between the metal 1 traces on either side of the rear mounting channel 64. The size of the shelf is a function, for example, of the etch ratios between crystal planes and the type of etchant. In this regard, some etchants such as EDP may result in significantly larger shelves than other etchants. If a surface passivation is not used, or will be added in a subsequent step, such as when passivating the trench to feed conductors out as previously described, one may remove all the surface passivation not masked by metal or resist.

If it is desired to attach an optical component such as a lens or fiber using a solder or other metal bonding surface (such as AlO bonding described by EP 0895111A1 and U.S. Pat. No. 6,034,405), the solder may be provided using an etched metal shadow mask in contact with the base wafer 110 at this time. Transient liquid phase (TLP) and thermally-activated diffusion (TAD) solders may be particularly useful for this application purpose. If provision for fiber bonding by solder is planned, the solder may be provided in step S100 or a subsequent step depending on the bonding hierarchy used. The bonding hierarchy is dependent, for example, on the complexity of the design (number of optical elements to be bonded using inorganic bonding, etc.). Typically, the solders may be from 3 to 5 microns thick. Uniformity and thickness control should be sufficiently tight to achieve the desired optical performance of the system, for example, when passive alignment is used among the optical elements from laser die 12 to the fiber 42.

Population of the optical microbench 100 with optical elements may be performed at step S130. The order of optical element population may vary. However, one typical method employed is to bond the first lens 22 first using a suitable bonding material, such as solder or solder glass. An entire wafer or a grid of parts removed from the wafer may be populated at the same time for maximum efficiency of the process. The laser die 12 may next be bonded.

Compression or thermocompression bonding are suitable techniques for bonding of the optical elements, as reaction of solder layers can be prevented until the die bonding steps are complete. Reaction of the solder layers may result in a compositional shift preventing the solder from reflowing adequately for successful die bonding. The optical fiber segment 42, lenses 22, 32 and other optical elements can advantageously be secured in place on the substrate using thermally-activated diffusion (TAD) bonding techniques provided by the present invention. This technique typically makes use of an at least three layer bonding structure over the pit 20, 30, groove 11, 40, or other surface of the silicon substrate to which the optical fiber 42 or optical elements are to be fixed. The structure includes at least first and second constituent layers separated by at least one diffusion inhibitor/barrier layer.

The materials forming the first and second constituent layers differ compositionally, and are typically selected from metals and metal-alloys. Material selection is based on the ability of atoms in the first and second constituent layers to inter-diffuse, the result of which is a composition having a melting point higher than that of the second constituent layer as originally deposited. Suitable materials for the first and second constituent layer include, for example, gold and indium, copper and indium, silver and indium, copper and tin, silver and tin, and bismuth and tin, gold and bismuth, respectively. In each case, the higher melting point metal is typically disposed below the lower melting point metal. Or, if a thin film solder stack of composition 1 is on top of a thin film solder stack of composition 2, then composition 1 would have the higher melting point. In addition to binary systems, ternary, quaternary and higher order systems can be employed. The multicomponent compositions can be modified to achieve known effects. The thicknesses for the first and second constituent layers are selected based, for example, on the desired melting point for making the bond, the subsequent higher temperature to which the bond should be stable after heat treatment and interdiffusion occurs. Typically, the layers have a combined thickness of 2 to 10 microns. The constituent layers can be deposited using known techniques, for example, physical vapor deposition (PVD) such as evaporation or sputtering techniques, or chemical vapor deposition (CVD). The specific technique employed will depend, for example, on the material and thickness to be deposited.

The one or more diffusion barrier layer between the first and second constituent layers minimizes or prevents inter-diffusion of atoms between the constituent layers during fabrication until the substrate is subjected to a predetermined threshold temperature. When the substrate is subjected to a temperature at or above the threshold temperature, the diffusion barrier loses its effectiveness and allows significant inter-diffusion between the constituent layers, resulting in a composition having a melting point higher than the threshold temperature and the melting point of the second constituent layer. Suitable materials for the diffusion barrier layer include, for example, platinum, nickel, TiW, TiN, Ta, and the like.

The thickness of the diffusion barrier layer is at least that thickness effective to suppress inter-diffusion between the constituent layers for practical working times, for example, at least dozens of hours to indefinitely at room temperature and for minutes or hours at the temperature at which the substrate is to be held for bonding parts to it (or for bonding two parts together.) The time required depends, for example, on the number of parts to be bonded on the same substrate and the time required to bond the parts. The diffusion barrier layer thickness will depend, for example, on the diffusion barrier layer and constituent layer materials, and the thermal history to which the structure is subjected. Typically, it is desired to minimize the thickness of the diffusion barrier layer in order to minimize the concentration of the layer's constituents in the final structure after heat treatment. The diffusion barrier layer may, however, be used to modify the characteristics of the final structure in a desired manner, for example, to harden or soften the final structure, to increase adhesion, to increase melting point, and the like. The diffusion barrier layer thickness is typically from 5 to 100 nm. As with the constituent layers, the diffusion barrier layer can be deposited by known techniques, for example, PVD or CVD.

The TAD bonding layer structure can optionally include one or more additional layers, for example, a barrier layer for preventing diffusion between the substrate and the first constituent layer and/or an adhesion layer under the first constituent layer for promoting good adhesion between the substrate and the layers thereon. For example, where the first constituent layer is a gold layer, a chrome barrier layer and a nickel adhesion layer can be provided on the silicon substrate. It may further be desirable to employ an oxidation-inhibiting layer over the second constituent layer, or any layers in contact with the atmosphere. For example, a thin layer of a noble metal such as gold or a thin polymer film may be useful when the primary layer would otherwise oxidize and it is not desired to use vacuum, reducing atmospheres, or fluxes. Other materials, for example, rare earth metals such as Lu, may optionally be added to help enhance the bonding effect between metals and oxides.

The bonding layer structure is typically formed layer-by-layer on the substrate surface. Alternatively, one or more layer of the bonding layer structure can be preformed and then bonded to the substrate.

A compression or thermo-compression bond may be formed between the optical element and the second constituent layer. This can be accomplished, for example, by a thin layer of gold (e.g., 0.1 micron) over an indium layer, where the indium layer has other elements of the TAD system below it. A mechanical displacement of gold occurs by the compression or thermocompression bonding of a lens into a pit coated with such a system, followed by annealing to produce the desired reflow temperature increase for the TAD system. This process protects the indium surface from oxidation, and still allows the lens surface to come into mechanical and chemical contact with the indium to create an oxide to metal bond. Optionally, the compression or thereto-compression bond can be formed in the presence of a surface oxide formed on the second constituent layer. The thin oxide may be broken during the bonding, thus exposing virgin metal in the second constituent layer that can create the Si—O-metal bond.

Without being bound to any particular theory, it is believed that this process mechanically deforms the surface of and disrupts the surface oxide present on the second constituent layer, thus forming a bond, between the optical fiber 42 or element and the second constituent layer. For example, in the case of a silicon oxide-coated lens and a structure formed from a gold (constituent layer 1) and indium (constituent layer 2) structure, an Si—O—In bond interface may be formed.

The structure is next heated to a temperature at which the diffusion barrier layer is no longer effective to prevent interdiffusion of atoms between the first and second constituent layers. This temperature may be above or below the melting point of the constituent layers, but is typically below the melting point of each constituent layer to minimize or eliminate movement of the optical element. The temperature will depend, for example, on the constituent and diffusion barrier layer materials. Typically, the heat treatment temperature can be any temperature below the reflow temperature, for example, from 25 to 100° C. below the temperature used to make the bond. At this elevated temperature, and with sufficient time, the diffusion barrier layer breaks down, and atomic diffusion between the first and second constituent layers occurs. Depending, for example, on the temperature and time of the heat treatment, and the thickness and composition of the constituent layers and diffusion barrier layer, a homogenous composition, a mixed solution of various phases, or a graded composition for the bonding structure may result. The resulting structure has an overall melting point (the melting point within the structure may vary as a result of compositional non-uniformity) greater than both the heat treatment temperature and the melting point of the second constituent layer. As a result, the optical element may be securely bonded in place and can be subjected to further heat treatment processing even at temperatures higher than those used in bonding the element.

Through this technique, numerous optical fibers, lenses 22, 32 and other optical elements can be accurately bonded and locked into place on the substrate surface with a great deal of flexibility in the bonding hierarchy. Due to the relatively low temperatures used in bonding the optical elements, standard solders such as Au—Sn eutectics can be used without the adverse effects caused by higher temperature processing. Because of the high-temperature stability of the bonded optical elements, these standard solders can be used for subsequent bonding of higher costing devices such as laser die to the substrate surface.

Thin film Au—Sn eutectic and near eutectic solders have a relatively short working life (e.g., 10 to 45 seconds) just above their melting points. Therefore, it is desirable to keep the base wafer 110 temperature below its melting point and as low as possible when attaching the laser die to the substrate. This can be accomplished by a combination of pressure and pulsing heat through the laser die 12 to tack each die in place. The same may be done for the back facet monitor photodiode 18 if it does not have solder deposited thereon. After all optical elements are bonded, the base wafer 110 may be heated, allowing the solder to solid state interdiffuse, raising its effective melting point to a sufficiently high temperature that it will prevent any significant die motion (caused by solder creep, relaxation, surface tension reshaping, etc) during any subsequent thermal processing (lid bonding, flex attach, board attach, etc). The laser die 12 can be bonded, for example, with a high precision die bonding equipment commercially available from companies such as Karl Suss of Germany or Toray of Japan. Such equipment can be fitted with infra-red vision post inspection allowing the machine to image through laser die 12 and/or the base wafer 110 to view the fiducials of both the laser die 12 and the optical microbench 100 to determine die alignment non-destructively, and use this information to ensure high accuracy bonding. Due to the desire to bond die using high precision bonding equipment without the benefit of active feedback of the optical axis alignment of the laser die 12, it is desired that the microbench parts and the laser die 12 have no metal obstructing vision through the parts of the fiducials and their respective alignment for non-destructive alignment inspection using IR cameras. In addition, laser die 12 are best constructed with the active region and alignment fiducials, if present, defined in the same lithographic step. This allows for accurate alignment of the laser, waveguide and microbench.

Once the laser die 12, back facet monitor photodiode 18, first lens 22, and any other optical, electrical, or mechanical elements to be housed within the lid 200 (e.g., wavelength locker, or wavelength selector, isolator if it is desired on the interior, etc) are bonded in place, the lid bonding step, step S140, may be performed, as detailed below. Alternatively, prior to bonding the lid 200 the remaining optical elements may be attached to the base wafer 110, at step S160.

Figure 4B:
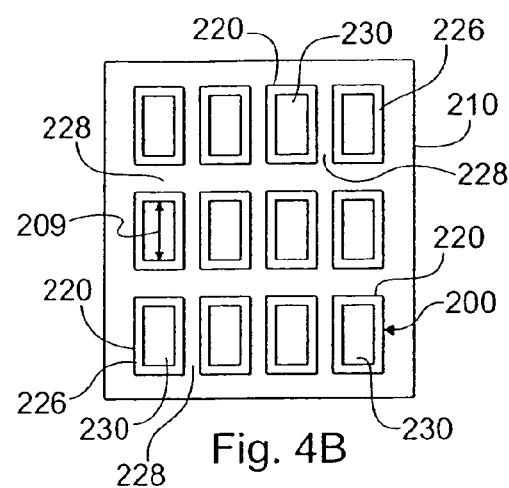
FIG. 4B schematically illustrates a top view (looking into lid cavities) of a wafer comprising a plurality of lids in accordance with the present invention.
Figure 4C:
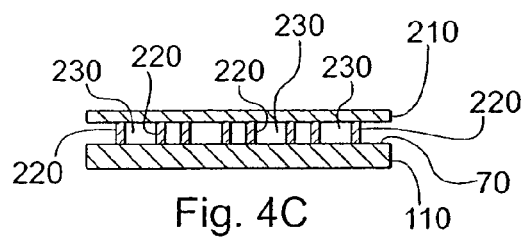
FIG. 4C schematically illustrates a side cross-sectional view of the lid wafer of FIG. 4B sealed onto the base wafer of FIG. 4A with the cross-section taken along one of the rows of microbenches.
Figure 4D:
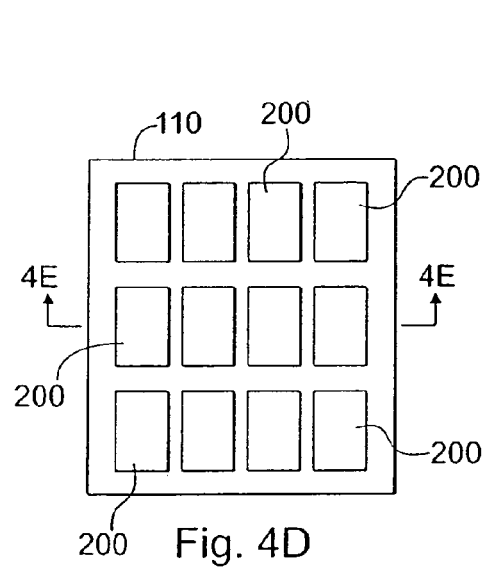
FIG. 4D-F schematically illustrate top and side cross-sectional views, respectively, of the assembled lid wafer and base wafer of FIG. 4C after the lids have been singulated from the lid wafer.

Regarding the lid attachment, at step S140, the lid bonding material 240, such as a solder glass, may be applied to the lid sealing surface 226 in paste form. Alternatively, the solder glass may be applied, for example, by screening, pad printing, or dispensing operations. The bonding material 240 may be cured on the lid 200 to eliminate evolved gases that form during curing. The lid wafer 210 may then be applied to the base wafer 110 (or lid wafer section applied to base wafer section), as shown in FIG. 4C. The lid wafer 210 and base wafer 110 may then be baked at a temperature, for example, above 100° C. in partial vacuum, dry nitrogen or other dry inert gas, to dehydrate the wafers 110, 210. The wafers are then heated to the bonding temperature of the solder glass, and then pressure is applied between the lid wafer 210 and the base wafer 110 to make a hermetic seal between each lid 200 and the respective optical microbench 100. If desired, the lid Wafer 210 and base wafer 110 may be sealed in a helium atmosphere at several atmospheres allowing the lid 200 to bulge and allowing for an integrated leak checking through inspecting the degree of bulge.

Figure 4E:
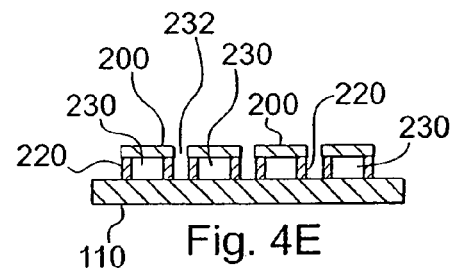
Figure 4F:
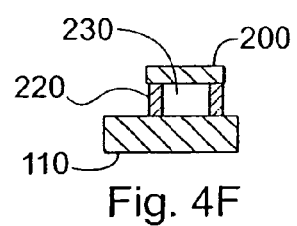

The lid wafer 210 may have a dielectric layer, such as a silicon-oxynitride layer disposed over the lid wafer 210, including the lid sidewalls 220 which can act as an antireflection coating. In addition, the lid wafer 210 may have a hard mask pre-patterned on the upper surface of the lid wafer 210. This allows the bonded assembly to be wet or dry etched at separation channels 228 to provide openings 232 through which electrical and/or optical probing may be performed on the micro-optical device packages from above the upper surface of the lid wafer 210 and prior to singulation of the micro-optical device packages, as shown in FIGS. 4B and 4E. Alternatively, one may partially dice through the upper surface to separate the lids 200 to provide openings 232 and probe metallizations on the upper base wafer surface 70. This allows laser die burn-in and high frequency testing to occur at the wafer level, at step 155.

For the case where the lids 200 have been sealed onto the base wafer 110 before the second lenses 32 have been placed onto the respective microbenches 100, a portion of the beam may be deflected upwards through the etched or diced openings 232 in the lid wafer 210 by a respective inclined surface in the base wafer 110. The ability to test the optical microbenches 100 at the wafer level can be provided by a beam deflector, which directs an optical beam out of the plane of the microbench 100 for testing. Since the optical beam is directed upwardly away from the optical microbench 100, the optical microbench 100 may be tested while multiple such microbenches 100 are connected to one another in wafer form.

Figure 2B:
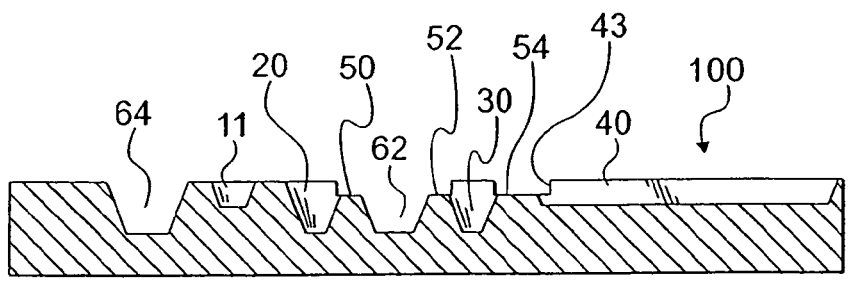

For an anisotropically etched (100) silicon base wafer 110, the inclined surface may comprise a {111} plane. The inclined surface may be an inclined sidewall 33 of the second lens pit 30 before the third recessed clearance surface 54 is added. The inclined sidewall 33 may be disposed along the optical axis and faces the direction of the laser die 12, as shown in FIGS. 1A and 2A. Alternatively, the inclined surface may be an inclined sidewall 41 of the fiber groove 40, as shown in FIG. 2B. To enhance the reflectivity of the inclined surface, it may be metallized or otherwise treated. In either case, the diced or etched openings 232 in the lid wafer 210 may be located at a position to permit the light deflected from the inclined sidewall 33, 41 to be directed through the openings 232. For operations such as burn-in, the optical signals may be imaged and analyzed to allow many devices to be monitored at one time efficiently. These surfaces can be left intact if the package requires light to be emitted surface normal, and in these cases, (100) silicon cut off-axis can provide a 45 degree reflecting surface, if desired.

Figure 8B:
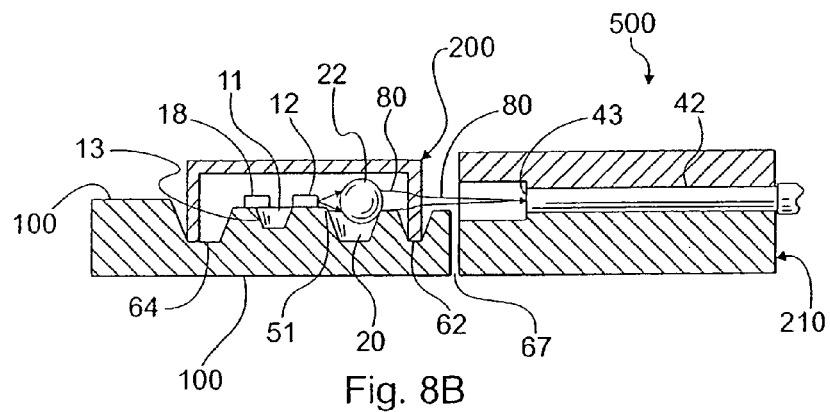

The second ball lens 32, outside the lid 200, may be bonded using, for example, solder glass, epoxy, or other suitable materials and methods. The microbenches 100 may then be diced apart leaving an open fiber v-groove on one end ready to accept a fiber segment 42. Alternatively, the base wafer 110 may be diced proximate the second lens 32 and may be actively aligned to a ferrule or sleeve assembly, as shown in FIG. 8B.

2. Microbench with Hermetically Sealed Conductive Vias a. Anisotropic Etch

Figure 13A:
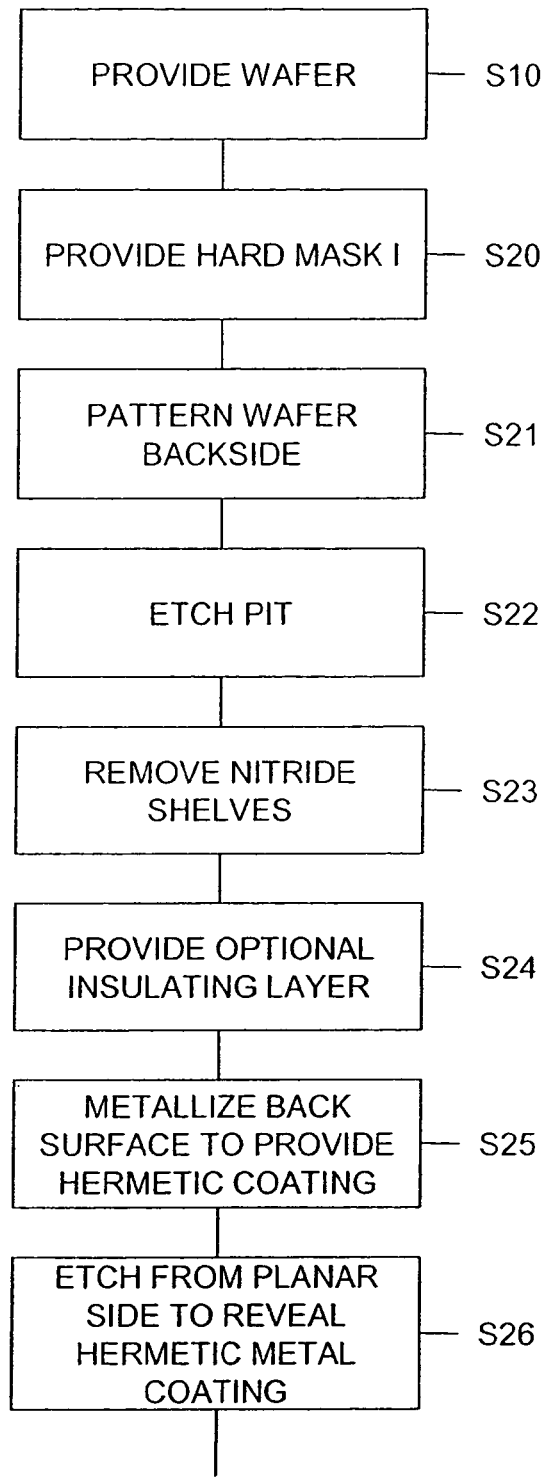
FIGS. 13A-13C illustrate a flowchart representing a process in accordance with the present invention for fabricating an optical microbench having conductive hermetically sealed vias.
Figure 13B:
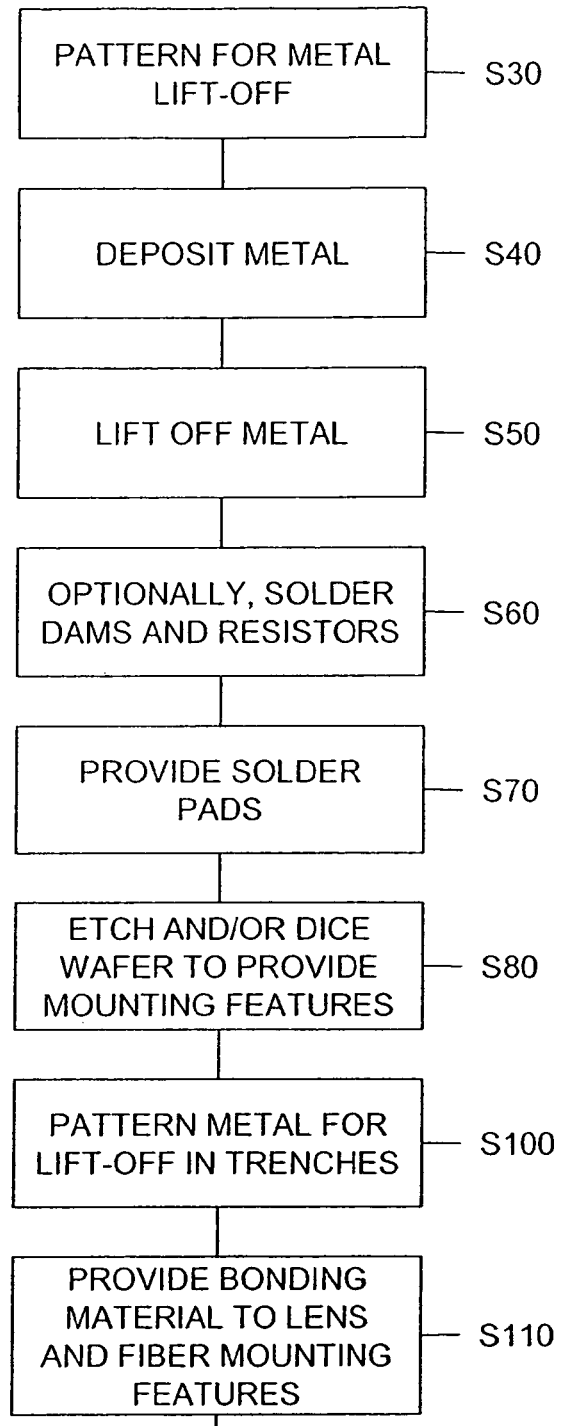
Figure 13C:
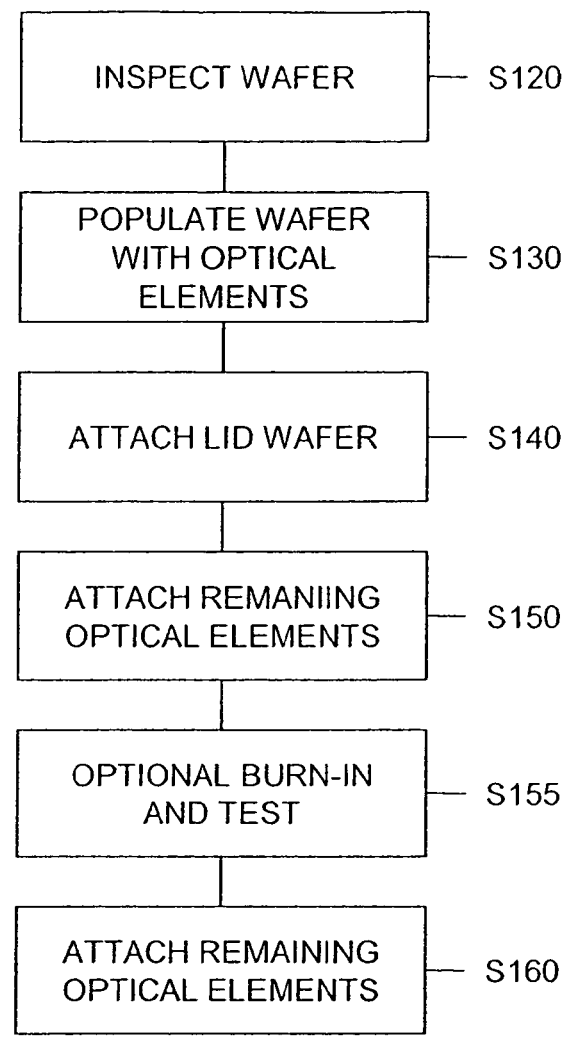

Referring to FIGS. 13A-13C, a flowchart of an exemplary process for fabricating an optical microbench 100 having hermetically sealed conductive vias 90 in accordance with the present invention is provided. The process is illustrated in FIGS. 14A-14G. The process may be similar in several respects to the process for fabricating a micro-optical device package 500 having conductive lead lines 14, as shown in FIGS. 12A and 12B. Accordingly, where similar process steps are involved, the same reference numerals used in FIGS. 12A and 12B is also used in FIGS. 13A-13C. However, while the same reference numerals may be used for particular steps, such steps need not be identically the same for both the via process and the lead line process, and several of the possible distinctions are noted in the text that follows. As with the lead line process, the via flowchart and processes are described by way of example with regard to making a single optical microbench 100 on a base wafer 110. However, it should be understood that in practice it is desirable to fabricate, assemble, and test a plurality of optical microbenches 100 on a single base wafer 110.

Figure 14A:
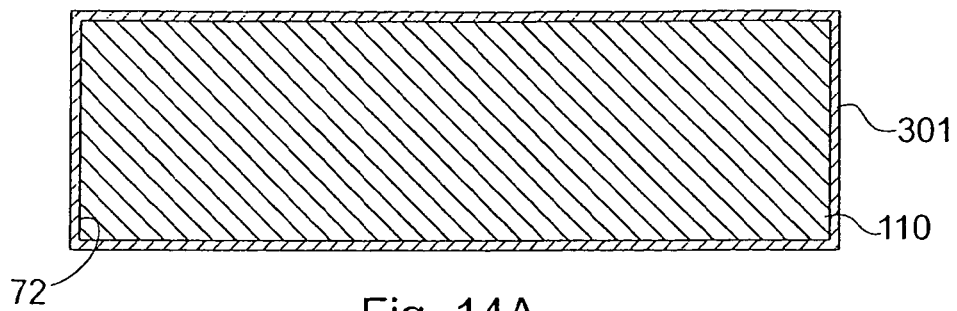
FIGS. 14A-14G schematically illustrate a process in accordance with the present invention for fabricating conductive hermetically sealed vias.

Turning now to FIG. 13A, beginning at step S10, a base wafer 110, such as a (100) double-sided polished silicon wafer is provided. The thickness of the base wafer 110 may conveniently be 525±25 microns thick, and the resistivity is typically greater than 1000 ohm-cm for high frequency applications, although lower resistivities may be used. A first hard mask 301 of low stress silicon nitride is provided on the base wafer 110, at step S20, as described above. FIG. 14A.

Figure 14B:
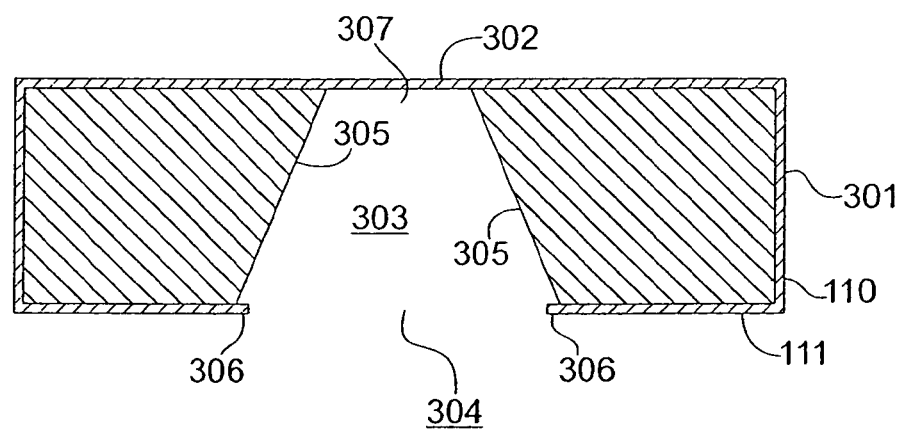

At step S21, the hard mask 301 disposed on the back surface 72 of the base wafer 110 may be patterned using standard lithography and dry etching techniques, for example, to provide an opening 304 for each via, as shown in FIG. 14B. The base wafer 110 may then be anisotropically etched through the opening 304 in the hard mask 301 until a pyramidal pit 303 is formed through the base wafer 110 to leave a silicon nitride hard mask membrane 302 spanning a via aperture 307 across from the opening 304, at step S22. The sidewalls 305 of the pyramidal pit 303 comprise {111} crystal plane surfaces. Based on known base wafer thickness, sidewall angle, and desired membrane span 307, one can calculate the size of the target opening 304 to be provided at the back surface 72 to produce the target via aperture 307.

During the step of etching the pit 303, step S22, the hard mask 301 at the opening 304 may become undercut to create nitride shelves 306 on the sides of the opening 304. Prior to metallization of the pit sidewalls 305, it may be desirable to remove the nitride shelves 306, so that the nitride shelves 306 do not cast a shadow that prevents metallization of the pit sidewalls 305 under the shelves 306. Prevention of metallization under the shelves 306 may prevent electrical continuity with later deposited metal layers.

The nitride shelves 306 may be removed by a dry etching step using, for example $CF_4$ at a pressure of typically 50 to 200 mT, at step S23. The pressure is typically a value sufficient to etch the nitride shelves 306 on the etched side of the wafer that will typically overhanging the pit sidewalls 305 without removing the membrane. Because silicon nitride can be chemically attacked by fluorine ions and other fluorine-containing species in the etching process, and because the pressure is high enough to allow significant scattering of the molecules over a short distance, both sides of the nitride shelves 306 are etched, whereas only one surface of the silicon nitride is attacked on all other surfaces because they are either bonded to the silicon wafer on one side or have a surface that is otherwise shielded (facing the reactor plate), etc. Thus, nitride shelves 306 can be removed without completely removing the aperture membrane 302 or the nitride on the rest of the base wafer 110. This step can be conducted at other stages, such as after the next nitride coating if such a coating is used, but should be conducted before the metallization to ensure continuity of the metallization on the surface and on the sidewalls 305. The step may be omitted, for example, where there is significant scattering during the deposition process, where the nitride shelf is small, or where a conformal conductor deposition is used. Instead of nitride, any other hard mask that does not self-erode, for example, silicon oxide or titanium dioxide, may be used.

Figure 14C:
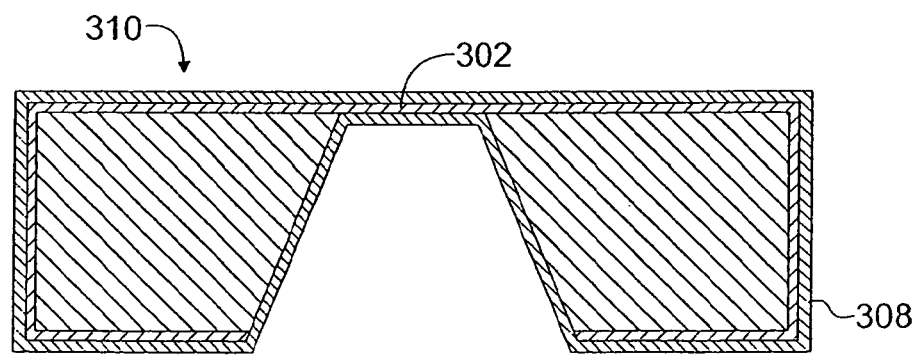

Next, at step S24, a second layer of low stress nitride 308 is provided, as shown in FIG. 14C. The second nitride layer 308 is an optional insulating layer of similar thickness (e.g., 200-500 nm) to the first nitride layer 301 and is used to electrically isolate the vias 90.

At this stage in the process, one planar surface 310 is covered by nitride membrane(s) 302 and one etched surface 72, with one or more etched pit-vias comprising {111} planes that terminate at a silicon nitride membrane 302 that is twice the thickness of the second nitride layer 308 plus the thickness of the first silicon nitride layer 301. The present via methods, whether conducted with wet etching or dry etching, provide at least one surface of the base wafer 110 with a high degree of planarity, allowing precision spincoating of resist and optionally contact lithography to pattern the subsequent mounting features that will be used for alignment of the optical elements on the silicon bench. In addition, the present process allows one to perform the second nitride coating before any metals or solders are applied, allowing the use of LPCVD silicon nitrides and oxides with conformal coatings of determined stresses.

Figure 14D:
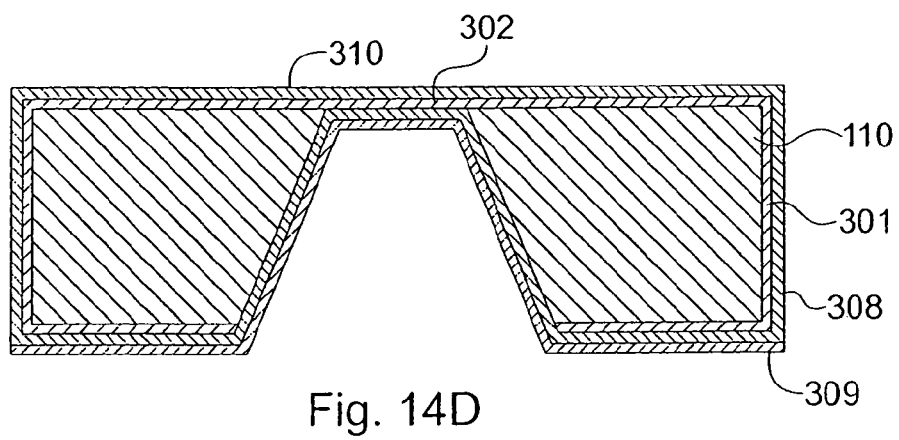

Returning now to the process illustrated in FIGS. 13 and 14, next the base wafer 110 may have its back surface 72 metallized with a metal layer 309, at step S25, as shown in FIG. 14D. Optionally, this metallization step may be done through a shadow mask, through a conformal lift-off resist, through a laminated patterned resist, etc. An advantage of using a patterned technique on the sidewalls 305 is that more than one independent conductive lead line 14 can be patterned through a single trench and membrane. For example in a rectangular trench with a single membrane, a series of feedthroughs can be made by patterning the back surface metal, the sidewall metal, patterning and etching the silicon nitride membrane appropriately, and patterning the top surface metal.

This structure allows for the ability to make strip lines that maintain improved impedance down the sidewall and through the via, and higher packaging densities of electrical conductors. In this way a single trench can become the conduit for a plurality, and advantageously, many conductors.

Alternatively, a blanket film may be deposited, for example, by evaporation in a rotary planetary. The metal layer 309 can later be patterned, for example, by wet etching using resist methods as described above. This metallization provides a layer of metal 309 (e.g., Cr/Ni/Au, TiW/Au, or Ti/Pt/Au), which covers the silicon nitride membrane 302 from the back surface 72 and provides conductivity down the pit sidewall 305 to the back surface 72. The metal is chosen to have sufficient mechanical strength to become free standing after the silicon nitride membrane 302 is removed or partially removed from the planar surface side of the base wafer 110. This provides a conductive and hermetic seal across the via aperture 307. For example, a stacked layer of 20 nm thick Cr, followed by 200 nm thick Ni, covered by 500 nm thick Au has sufficient mechanical strength to span, for example, 20 to 35 microns across the via aperture 307. Thinner or thicker metal layers may be used. In addition, one can electroplate such metals economically to greater thicknesses if needed for greater strength, larger membranes, or higher currents.

If a blanket metallization is used on the back surface 72, patterning should allow the multiple electrical contacts to be separated. This step can be performed at any point that is convenient. The patterning can be conducted using commercially available resists, for example, electrodeposited resists from Shipley Company, L.L.C., or laminated resists. It is further possible to mechanically dice the metal, penetrating into the silicon a small amount to electrically separate the film into separate vias 90. As another variation, it is possible to wet or dry etch vias from both sides of the base wafer 110, which may allow a greater packing density of vias in the same space. For example, if double-sided wet etching is employed each sloping {111} plane may run close to another. This may be useful when a precise thickness of silicon is desired to form a grounded strip line or grounded co-planar configuration. On the back side of the wafer or in cases where vias are not used on the lid side, solder balls or solder pillars of suitable height to clear any silicon topology can be applied to the silicon package. This can be performed, for example, by a solder ball shooter, a mask template, plating, and the like. The packages can be surface mounted directly to a PWB, if desired. Further, the electrical bond pads of the package can be laid out in such a way that they can be directly attached to a lead-frame assembly after separation.

Figure 14E:
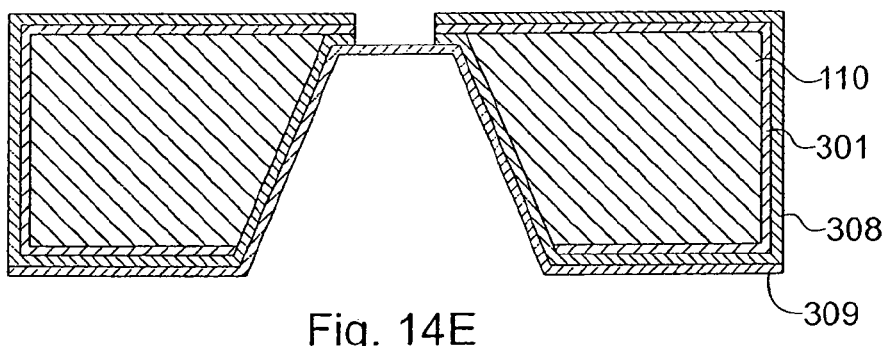
Figure 14F:
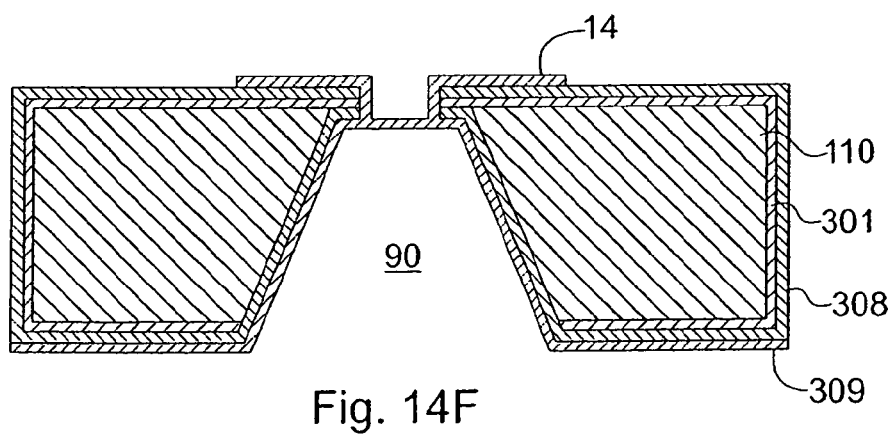
Figure 14G:
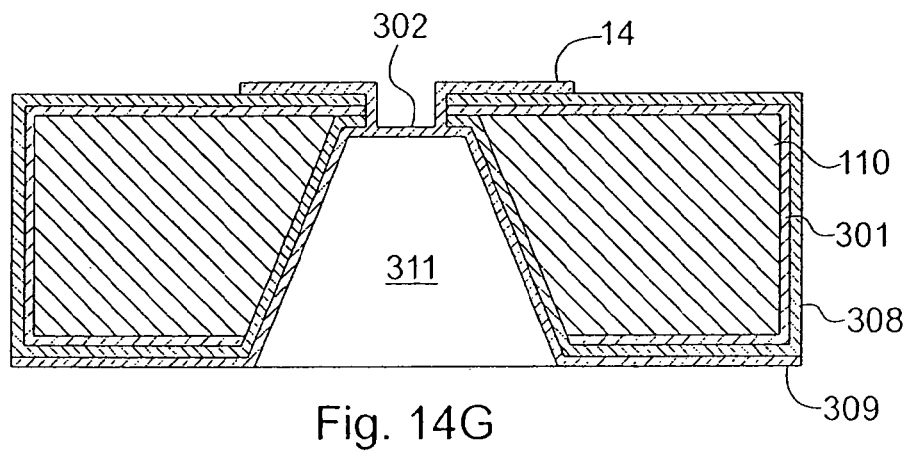

Returning to FIG. 14D, the base wafer 110 has a hermetic metal layer 309, typically topped with gold, which provides electrical continuity from the back surface 72 down one or more sidewalls, and covers the silicon nitride membrane 302. In step S26, the base wafer 110 is coated with resist, patterned, and dry etched from the planar surface side to remove silicon nitride from the membrane without etching the metal layer 309 disposed in the via aperture, as shown in FIG. 14E. Any pattern can be opened from the planar surface 310. For example, one can open a series of holes, grids, or other shapes in the nitride layers 301, 308 over the metal layer 309, allowing the nitride to provide added mechanical stability if desired. The metal layer 309 may act as a suitable etch stop for a plasma etch. Further, the via 90 may be filled with a dielectric material 311 or may be plated thicker, as illustrated in FIG. 14G, at any suitable stage in the process. As mentioned above, the nitride may also be patterned in a way that allows multiple conductors if the metal on both sides and the sidewalls can be appropriately patterned. Typically, a rectangular shape would be used to make the patterning and spacing easier.

From this stage in the process, processing may proceed with steps S30 to S80 and S110 to S160 in a fashion similar to that provided above with respect to the conductive line method illustrated in the flowchart of FIG. 12. Referring to FIG. 13 of the present via method, steps S30 to S50 may provide metallization of the planar surface 310 to provide conductive lines 14 that electrically communicate with the metal layer 309 of the via 90, as illustrated in FIG. 14F. Step S90 may be omitted from the present via method, because conductive lead lines 14 are not required in the rear lid mounting channel 64. However, step S100 may be modified to provide a metal layer in the base of the lid mounting region 60 (or as a sealing ring if a moat is not used) for the purpose of sealing a lid 200 to the base wafer 110, rather than provide conductive lead lines in the rear lid mounting channel 64.

Again, a standard metallization such as those described above may be used to provide a sealing ring that is the shape and size of the sealing surface 226 of the lid 200. A metal or glass solder may be deposited on the base wafer 110 or on the lid wafer 210, or both. If a solder glass or other adhesive that will wet to the silicon base wafer 110, or to any insulating dielectric film that may be on base wafer 110, is used to seal the lid 200, a metallization step, S100 is not required. The metal layer may be applied, for example, by shadow masking, by lift off, or by chemical etching of the metal, among other methods known in the art of microelectronics. It will be obvious to one skilled in the art, that most steps where evaporation or sputtering has been specified may also utilize electro-chemical and electroless chemical metal deposition methods (plating) of one or more metals, for example, using a seed process and patterned mask if desired. This may be especially useful for relatively thick layers, for example, thick gold-containing layers such as thick Au—Sn layers and some RF transmission lines. Any combination of chemical plating, CVD, and PVD methods may be employed.

In addition, regarding the lid attachment, at step S140, the lid bonding material 240 may comprise a solder glass as explained for the previous method. Alternatively, since conductive lead lines 14 are not present in the rear mounting channel 64 of the present via method, the lid bonding material may comprise a metal solder, for example, 80:20 Au—Sn 3 to 8 microns thick on the lid sealing surface 226, the base wafer 110, or both. A surface not having the metal solder is typically metallized with a wettable and adherent metallization, such as Cr—Ni—Au, although other materials can be used. For example, Pt may be used in place or in conjunction with Ni. Optionally, the Au layer may be patterned, or the entire sealing ring may be patterned, in such a way to cause the metal solder to selectively flow in given regions, wicking more or less solder where desired during the lid attachment step, S140. Such an arrangement can be useful if there are regions of transition or higher surface roughness and a thicker metal solder layer is desired for the seal in that region. This technique can be used under the Au—Sn layer as well by patterning the underlying Cr—Ni adhesion/barrier layer, since the metal solder will not readily wet a silicon nitride or silicon surface as compared to a metal film coated with Au.

The process of sealing may typically involve baking the lid wafer and the base wafer 110 with the bonded laser die 12 in a controlled environment, for example, with an inert gas such as He, Ar, or $N_2$ or under vacuum, to remove any water vapor present. The lid 200 is then applied with some pressure and the part is heated to the reflow temperature of the metal solder. Optionally, the pressure may be applied after the reflow temperature is reached. It may be beneficial to seal under a pressure of He such that when cooled, the sealed area has a pressure significantly higher than atmospheric pressure. This technique will allow for monitoring the level of hermeticity or leak rate in the package at any time subsequent to making the hermetic seal. This allows the deflection or curvature of the lid 200 to be inspected at any point using an automated interferometer. The results of such measurement can provide an indication of the hermeticity level of the package and whether it has been compromised with a measurable leak. For example, when the package volume is less than 1000 nl, the dwell time for leaks greater than $10^{-8}$ torr liters/sec is relatively short, causing the lids 200 to substantially change their curvature. The balance of the process steps may proceed as given above for the conductive lead line method.

In addition to the process described above for forming vias 90, several variations are possible. For example, in the above-described method, the metal layer 309 is formed on the etched side of the nitride membrane 302 and the nitride membrane 302 is cut through from the planar surface 310. It is possible to reverse this, placing the metal layer first on the planar surface 310 of the nitride membrane 302 and cutting the nitride membrane 302 from the back surface 72. This process would be aided by the use of a conformal resist. Further, the second nitride layer 308 may be omitted, for example, if the electrical design does not require this level of isolation. If greater levels of electrical isolation are required, a thermal oxidation step may be performed instead of, or before the second nitride layer 308 is formed, which may help to prevent pinholes. This may be useful when vias 90 are made by dry etching, which may have high topology on its etched surfaces.

It will also be evident to one skilled in the art of wafer processing and micromachining, that other materials and methods may be substituted to get the same or similar results. For example, laser machining may replace etching steps, certain types of plasma enhanced chemical vapor deposition (PECVD) can produce films that can be of sufficient quality to be used instead of LPCVD. Organometallic chemical vapor deposition (OMCVD) may be used to reduce the thermal budget and allow the order of steps to be significantly changed, such as producing insulated vias later in the wafer processing rather than before the metallization steps. Electroless seeding and electroless plating of nickel and gold may be performed instead of vapor deposition methods. This can be usefully applied to high aspect ratio vias when the throwing power of the other methods is too limited, such as using a palladium chloride/stannous chloride solution into which the parts are dipped and agitated. The chloride salts are reduced in an acid dip rendering seed of Pd and/or Sn on the surface. The parts are then put into an electroless Ni solution and plating occurs. If the Ni is plated with tensile stress, the best results will be found for making a hermetic and rugged seal on the inside of a via so that the nickel is forced into intimate contact with the via pit 303. This can be followed by an immersion in electroless gold.

b. Apertured via

Figure 15A:
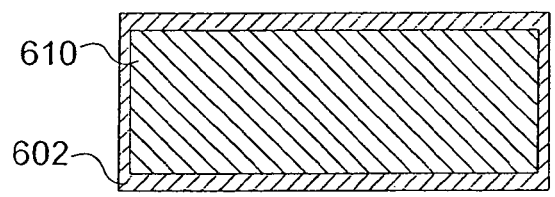
FIGS. 15A-15H schematically illustrate another process in accordance with the present invention for fabricating conductive hermetically sealed vias FIGS. 16A-16D schematically illustrate top views of a process in accordance with the present invention for fabricating cavitated lids on a lid wafer.

FIGS. 15A-15H schematically illustrate another process in accordance with the present invention for fabricating conductive hermetically sealed vias that have a plurality of apertures formed therein. With reference to FIG. 15A, an etch stop layer 602 is formed on wafer 610. The etch stop layer 602 is a material that can function effectively as an etch stop in subsequent via formation etching. The etch stop layer can be, for example, a silicon oxide such as silicon dioxide formed by thermal oxidation, or other known materials. The etch stop layer is deposited to a thickness such that it will not fully erode during subsequent etching processes. Typically, the thickness is from 0.5 to 2 microns, for example, from 1 to 2 microns.

Figure 15B:
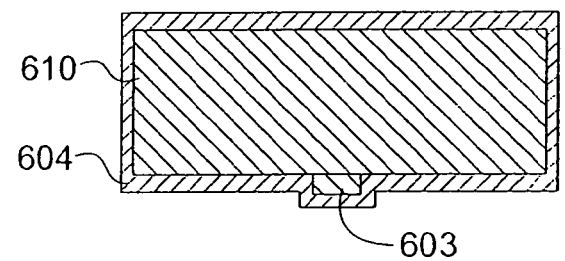

With reference to FIG. 15B, the etch stop layer is patterned by photolithography and dry etching processes to form an etch stop pattern 603. The pattern remaining after etching may be of the same or different geometry than and extends beyond the periphery of the via hole to be formed.

A structural coating 604 of a suitable material, thickness, and stress may be provided for a future free standing membrane on one surface of the wafer 610. The structural coating 604 can include one or more layers, for example, of a low stress silicon nitride layer, a polysilicon layer, or a combination thereof. Structural coating 604 is typically from 0.2 to 1 microns in thickness. The materials used in forming the etch stop pattern 603 and the structural coating 604 can be the same or different, depending, for example, on the etchant. The same material may be used, for example, if the material of the membrane to be formed can act as a suitable etch stop in the via etching process, or if there is sufficiently high uniformity in the via etching process to create the membrane. The structural coating is patterned using photolithography and etching processes. A metal mask may optionally be used for this purpose.

Figure 15C:
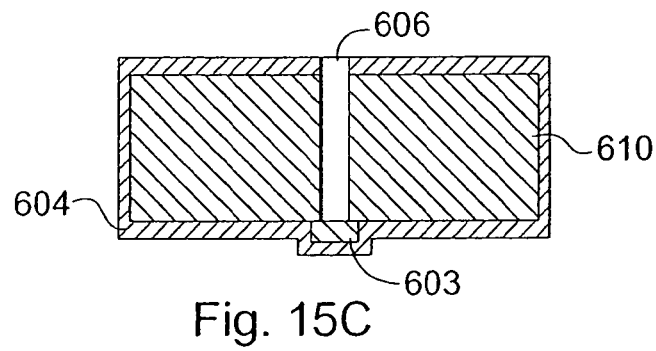
Figure 15D:
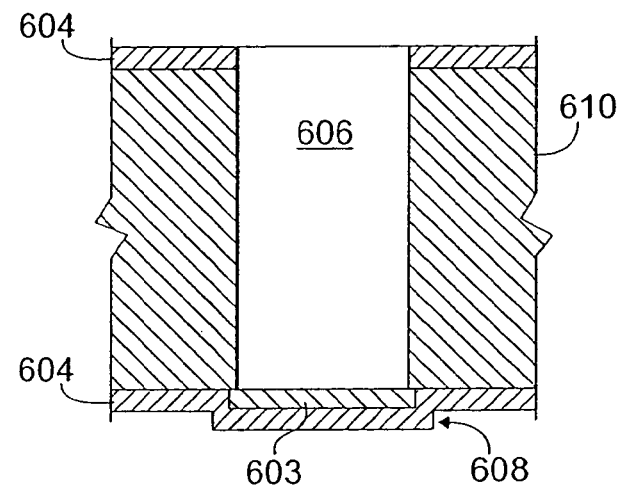

With reference to FIGS. 15C and 15D (partial enlarged view of 16C), via holes 606 are etched in the nitride layer 604 and wafer 610 from a first side opposite the etch stop 603 down to the etch stop. The etching is typically conducted anisotropically by dry etching, for example, deep reactive ion etching. Etching of the nitride and silicon may be conducted in the same or different steps. The via dimensions will depend on various factors. The dimensions may be, for example, from 150 to 250 microns in diameter and about 500 microns in depth. The via hole can be of various geometries, and is typically cylindrical in shape.

Figure 15E:
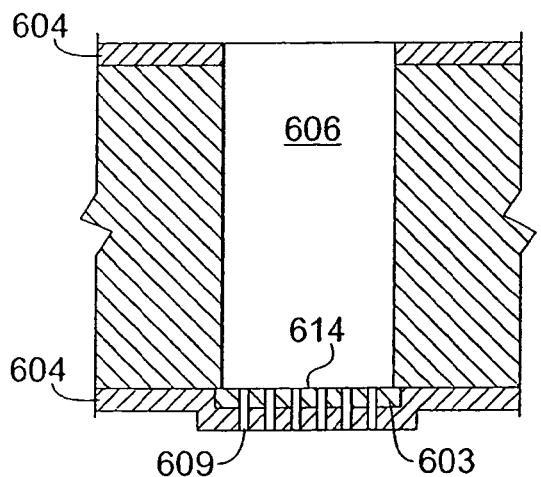
Figure 15E:
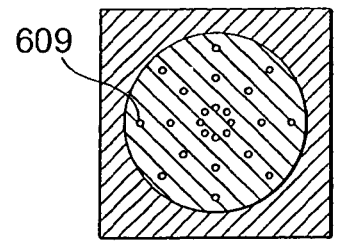

With reference to FIGS. 15E and 15E' (top down view of FIG. 15E), patterning of the previously formed membranes is conducted as follows. Through photolithography and one or more etching process, for example, dry etching such as reactive ion etching, a plurality of apertures 609 are formed in the etch stop pattern and structural coating. The mask remaining on the structure is removed. The apertures can take various forms, for example, circular, square, rectangular, arcuate, and the like, and combinations thereof. For example, the apertures 609 can all be circular as illustrated or, alternatively, can include various aperture forms, for example, a series of arcs of circles around a central circle in a coaxial-like form, and the like. The dimensions of the apertures should allow them to be later filled with a metal or other conductive material, for example, doped polysilicon. Typically, the apertures 609 have least one axis of from 1 to 3 microns across. The design employed should allow signals to be transferred from one side of the wafer to another with minimal distortion and loss, when high frequencies are involved. Further, the pattern of the apertures 609 may be optimized for one or more parameters such as mechanical strength, conductivity, ease of filling, etc. The surface of the membrane opposite the via hole is generally planar, for example, within a few microns, making it suitable for spin coating and precision lithography.

Figure 15F:
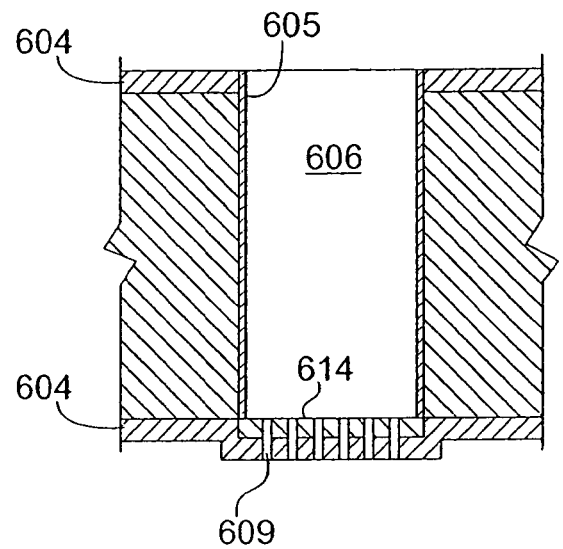

With reference to FIG. 15F, a resist mask is next formed on the wafer, and the sidewalls of the vias are passivated with one or more dielectric layer 605, for example, a silicon nitride such as low stress silicon nitride, or an oxide such as thermal silicon dioxide or a low temperature silicon oxide, and combinations thereof. The dielectric layer 605 protects exposed areas of the via sidewalls during subsequent processing. Advantageously, the dielectric layer may include a thermal silicon dioxide layer as a first layer to minimize or eliminate the presence of pinholes. Dielectric layer 605 is typically deposited conformally to a thickness of from 0.1 to 0.25 microns and should not close off the apertures 609. Optionally, the dielectric layer can be formed prior to formation of the apertures 609 in the membrane 608.

Figure 15G:
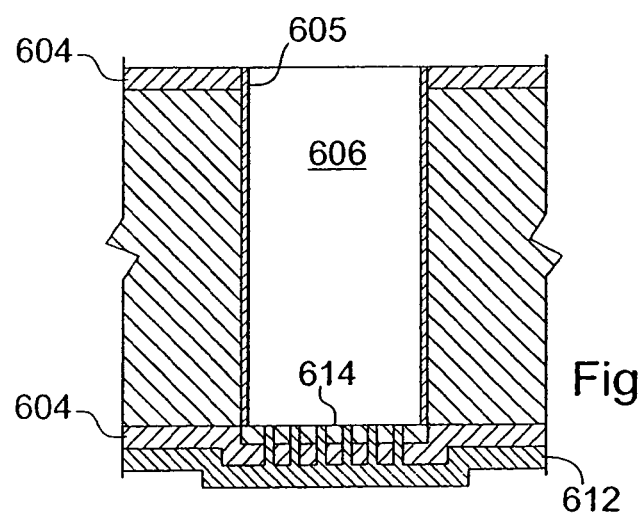
Figure 15H:
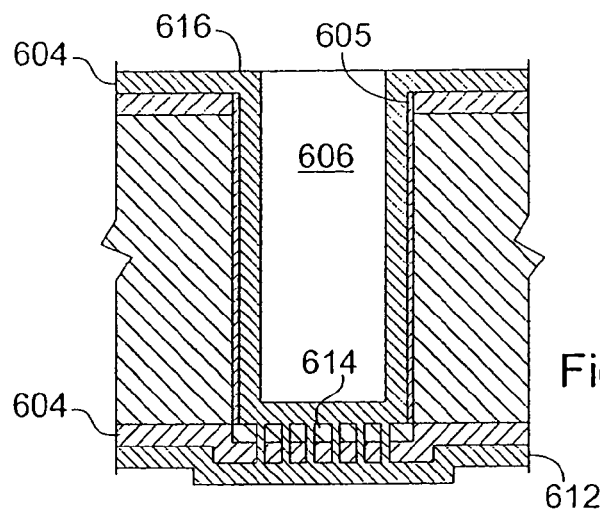

With reference to FIGS. 15G and 15H, the via holes 606 are next hermetically sealed, for example, with one or more metal layer 612. The coating may be applied to either or both sides of the wafer, and to the apertures 609 to form plugs therein. The one or more metal layers may include, for example, one or more of an adhesion layer, a diffusion barrier, and a top conductor layer. The metal layer 612 can comprise, for example, tungsten, titanium, platinum, palladium, chromium, copper, chromium, nickel, gold, and alloys and combinations thereof, for example, Cr/Ni/Au, Cr/Au, Cr/Cu, Ti/Pt/Au, and the like. While technically not a metal, the structure may further include a polysilicon layer, for example, doped polysilicon. The metal layer can be deposited, for example, by PVD such as sputtering or evaporation, CVD or electroless or electrolytic plating processes. It can be selectively deposited, for example, by CVD or plating processes. Exemplary via sealing processes will now be described.

A first exemplary process employs a selective CVD-deposited metal such as tungsten. A seed layer for the selective metal layer can first be deposited on surfaces on which the metal is to be formed. In the case of tungsten, for example, a polysilicon film such as a highly doped polysilicon can be deposited as a seed/adhesion layer. The polysilicon layer is patterned, optionally on upper and lower surfaces of the wafer 610, and the via sidewalls. Tungsten is selectively and conformally deposited on the polysilicon by CVD, for example, using $WF_6$ and may fill the apertures 609 of the membrane. The apertures 609 in the top surface can alternatively be closed through other techniques known to those skilled in the art with conductive plugs.

A further exemplary process employs electroless plating. The wafers can first be seeded using various chemistries, for example, PdCl/SnCl, reduced and electrolessly plated with a metal, for example, with nickel to fill the apertures 609 and form a layer over the via sidewalls. This can be followed by an immersion plating process, for example, immersion gold. Other materials and plating processes can alternatively be employed. The thickness of the deposited film should be greater than half of the width of the largest aperture 609. The metal can be formed with compressive stress to help ensure adhesion to the surface.

A still further exemplary process for metallizing the vias employs evaporation using, for example, a rotary planetary evaporation system.

Once the vias are plugged hermetically, additional surface metal patterning and/or micromachining steps can be formed to create microbench elements. Conventional processes described elsewhere in this application cover the methods to process the top (planar) surface. The back side, containing the via holes 609 (if they are not plugged), can be patterned with a resist, for example, using an electrophoric resist such as EAGLE™ resist, available from Shipley Company, L.L.C., a laminate resist, or a shadow mask. The via can optionally be filled with a metal, for example, copper or nickel, through PVD, CVD or plating processes.

While the above lead line and via formation process steps have been presented in an exemplary order, one skilled in the art will appreciate that the order of several of the steps may be varied. Depending on the version, one might change these steps, their order, insert several more steps, layer thicknesses and/or change their target stresses, etc. Furthermore, one versed in the art of silicon micromachining will recognize the proper insertion of cleaning steps, the proper lithography, stripping, coating technology etc., which have not been mentioned for this reason. Further, by creating conductive slots surrounding a conductive square, it is possible to simulate the effects of co-planar and strip line type transmission elements. In addition, the via patterning on the bottom side can be conducted in a way to help create interconnects such as pins and sockets, or to house solder balls that will be later reflowed to make bumps.

3. Lid Fabrication

The lids 200 may be etched from a silicon lid wafer 210 to provide a grid of lids 200, as shown in FIG. 4B. The grid comprises a grid of cavities 230, each cavity 230 surrounded by sidewalls. In the exemplified embodiment, four sidewalls 220 intersect at each sidewall end to form a rectangular perimeter that defines each cavity 230. As shown in the top view of FIG. 4B, the sidewalls 220 extend out of the plane of the paper. The space between each of the lids 200 may also be etched away or diced away or both, optionally to the same depth as the lid cavities 230, to provide separation channels 228 between the lids 200.

In accordance with the present invention, a variety of methods are provided for creating the etched grid of lids 200 illustrated in FIG. 4B. The principal variations in the methods are in the etching techniques and the lid wafers 210 utilized. The choice of etching techniques and lid wafers 210 depends, for example, on the design, capability of the process to achieve the desired optical finish of the sidewalls 220, and the ultimate size of the lids 200. In cases where the light may be, in addition or alternative to the lid sidewall, projected through the lid roof 250 or through the base it attaches to, the optical finish of those surfaces also impacts the type of etching and the type of wafer (e.g., S01) chosen to make the lid wafer 210.

The sidewall thickness may be chosen to be as thin as will give suitable mechanical performance, since minimizing thickness maximizes the packing density and minimizes impact on RF performance when conductive lead lines 14 pass under the lid 200, or pass under a dielectric layer under the lid 200 when, for example, a sealing glass is used. In the case of conductive lead lines 14 that are to transmit RF power or signals, minimization of RF discontinuity is desired. It may therefore be desired to keep the wall width to a small fraction of the RF wavelength at the highest frequency that will be transmitted along the lead lines 14, or otherwise to minimize or control the field interactions at such changes in the boundary conditions. Larger lid wall thicknesses may employ a change in the lead line dimension to compensate for a net change in dielectric constant or absorption coefficient at the design frequencies. However for smaller lids 200, it may be beneficial to minimize the discontinuity magnitude itself. It will be evident to one skilled in the art of RF design that these considerations are relative to the size of the features and the wavelength, and different decisions how best to handle RF transmission will be made at various frequencies. For example, at higher frequencies, if signals are to be propagated over the silicon surface 70 and under the lid 200, a thick oxide on the substrate and very thin sidewalls (e.g., 10 to 50 microns) may be used. In this way, field interactions with higher dielectric constant materials (e.g., silicon and solder glass) may be minimized.

In general, very low roughness anisotropic deep silicon dry or wet etching of (110) silicon wafers, or a combination of these two processes may be used to fabricate the grid of thin sidewalls 220 to provide the grid of open cavities 230 for sealing into the lid mounting channels 62, 64, 66, 68 or alternatively to the surface of the base wafer 110. The vertical deep etching may be performed, for example, using Bosch or Cyrogenic processes or any other suitable anisotropic dry etching process. Commercial plasma etchers such as those made by Alcatel, Surface Technology System, and PlasmaTherm may be used.

The etched sidewalls 220 typically have highly smooth surfaces at least at those regions where light is to pass through the sidewalls 220. For example, roughness of less than about 25 nm may be desired to keep the scattering losses below 10% at the 1250 to 1650 nm wavelengths. It should be made clear the degree of scattering for a given roughness and a given wavelength is a function, for example, of the type of surface roughness present, the wavelength of light, and the angle of incidence. The desired sidewall height and lid thickness are a function, for example, of the height of the devices to be housed inside the cavity and the surface area they require.

a. Dry Etching in Silicon

A first method for fabricating the lid grid in accordance with the present invention comprises dry etching, for example, anisotropic dry etching, of a silicon lid wafer 210. The silicon wafer 210 may comprise any standard orientation, such as (100), (110), or (111) silicon. The dry etching may be performed with alternating passivation and etch cycles using, for example, a Bosch process. Typically, the cycles have short intervals and relatively slow rates. Post polishing processing may optionally be used to help attain the desired surface roughness level. Such polishing may involve, for example, oxidation and stripping processes or isotropic chemical polishing.

b. SOI Dry Etching in Silicon

In a similar method to the method described above, a grid of lids 200 may be fabricated by dry etching, for example, anisotropic dry etching of an SOI lid wafer 210. The SOI lid wafer 210 may include, for example, a thick oxide layer (e.g., 1 micron thick) disposed between a handle layer (e.g., 400 microns thick) and a device layer (e.g., 40 microns thick). The lid roof 250 is formed from the device layer and the lid sidewalls 220 are formed from the handle layer.

While an SOI lid wafer 210 is generally more expensive than a silicon wafer of the same quality, dry etching of an SOI wafer can provide better control of the etch depth as the oxide layer can act as a etch stop. Variations in etch depth across the wafer can be minimized, thus resulting in a uniform structure and a smooth, uniform device layer (or lid) surface.

For both of the above dry etching methods, dry etching can be used to define optical sidewalls 220 having shapes other than the four plane parallel side-surfaces of a box. For example, shapes such as gratings, prisms, or cylindrical lenses may be defined on one or more of the silicon surfaces, such as on the sidewalls 220. Thus, added optical functionality can be incorporated into the lid 200 to enable more complex optical and mechanical designs.

c. Wet Crystallographic Etching in Silicon

A third method for fabricating the lids in accordance with the present invention comprises crystallographic etching of (110) silicon, where alignment of a selected edge of the mask aperture(s) is made along the [110] axis. The crystallographic etch may then be performed by etching through the mask apertures using known crystallographic etches, such as those based on KOH and EDP, for example. When properly aligned to the surface of a (110) wafer, the etching produces a plurality of lid cavities, each having two planar parallel opposing sidewalls which are substantially perpendicular to the plane of the lid wafer and which have very smooth sidewall surfaces.

In this method, it may be beneficial to suppress the <111> etch rate, because the {111} planes create the planar perpendicular sidewalls that are used for optical IR transmission. For example, the etch rates are approximately 60 to 150 times slower for the {111} plane than for the {100} plane. The etch rates of the {111} plane relative to the {100} varies for different etchants. The differences in etch rates may be used to help planarize the {111} surfaces. This may be desired, for example, when misalignment of the mask and silicon wafer produce step defects, when the starting surface roughness is too high, and/or when a greater degree of sidewall planarization is desired. The other two sidewalls of the cavity may be shaped with vertical sidewalls angled, for example, 70.5 degrees, relative to the first vertical sidewalls. Alternatively, a box with 90 degree angles can be etched.

It should also be noted that when wet crystallographic etching alone is used, a small degree of wedging may be created during the etch. Wedging is believed to cause some deflection of a collimated beam passed through the walls. Without intending to be bound by any particular theory, it is believed that the wedging is caused by the slow {111} attack rate and the top of the etched sidewall 220 being exposed to this attack for a significantly longer period of time than the area of the {111} planes at the bottom of the sidewall that are only exposed at or near the end of the etch. Changing the agitation method, slowing the etch rate or changing the relative etch rates of the crystal planes may reduce or nearly eliminate this effect.

d. Wet Crystallographic Etching in SOI

As a further lid fabrication method, an SOI wafer (of the type described above) may be used in the wet crystallographic etching method described above. With SOI, the insulator layer may be used as an etch-stop. Crystallographic etching of an SOI wafer may result in a more uniform lid roof thickness and suitable smoothness for passing an optical beam through the lid roof 250 than the silicon wafer etching technique.

e. Dry and Wet Combined Etching

As yet a further lid fabrication method in accordance with the present invention, a dry etch such as a deep reactive ion etch in an SOI wafer above may be performed, along with a subsequent wet etch step. The method may include a first, dry etch step such as described above with reference to "SOI Dry Etching in Silicon". The dry etch step may be performed in a manner that provides a sidewall 220, 221 that is optically smooth and perpendicular to the plane of the lid wafer 210. The dry etch may be carefully performed with the mask aligned to the crystal axes, so that minimal surface irregularity removal is required by the subsequent wet etch step.

To correct for any resulting roughness and angular variation from perpendicular, a crystallographic wet etch may then performed. The wet etch typically proceeds for a few minutes up to 30 minutes depending on the degree of surface smoothing required. It may be preferable to achieve the smoothing using shorter etch times. Therefore, it is desirable to achieve a low surface roughness (e.g., less than 50 to 100 nm) in the initial dry etch step.

Notching can reduce the quality of the {111} bound sidewall surfaces by exposing additional crystal planes that can be attacked during the crystallographic post etch. During the etching process, etching continues until the slower region planarizes on the oxide stop. During this "over etch" period, regions that first have exposed the oxide may experiences a surface charge build-up on the oxide surface due to interactions with the plasma etchant. This may destroy the local passivation on the lower surrounding sidewalls and cause the silicon to etch laterally, or undercut along the oxide surface. If only dry etching is used, this effect is not as significant as if post wet etching is used. The undercutting can expose crystal planes making anisotropic wet etch surface clean up of the sidewalls more challenging. Therefore, it may be desirable to use a machine capable of detecting the etch endpoint or capable of altering the etching process in a way to minimize the notching effect. Endpoint detection systems are commercially available, for example, from STS Systems of Portsmouth, N.H., USA.

While the above dry and wet etch process may be performed on an SOI wafer, it is possible to use a silicon wafer rather than an SOI wafer.

f. "Venetian Blind" Approach

Figure 16A:
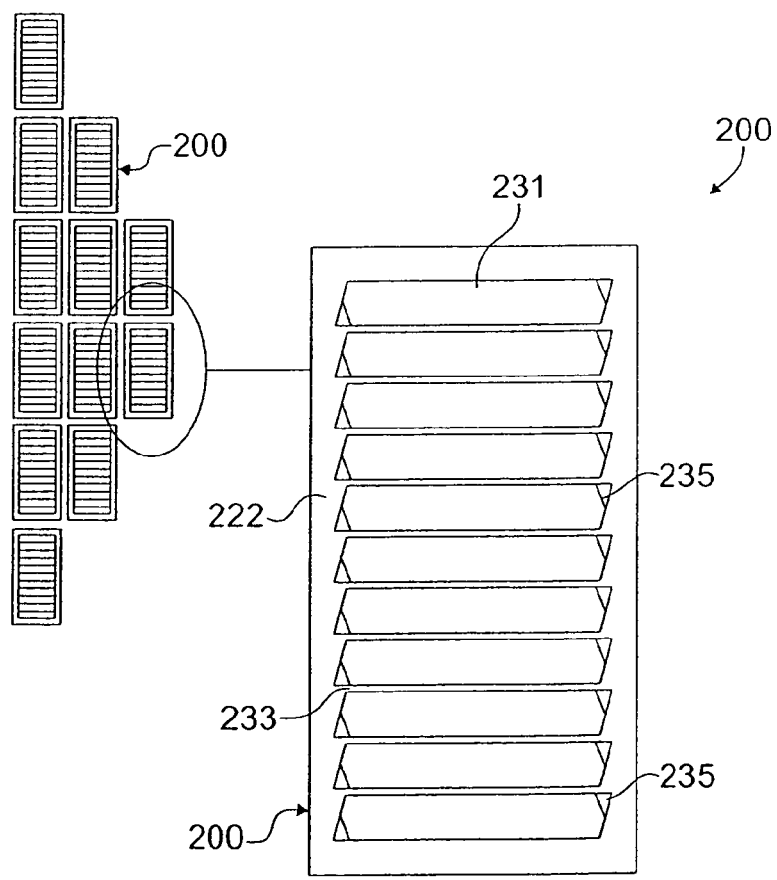
Figure 16B:
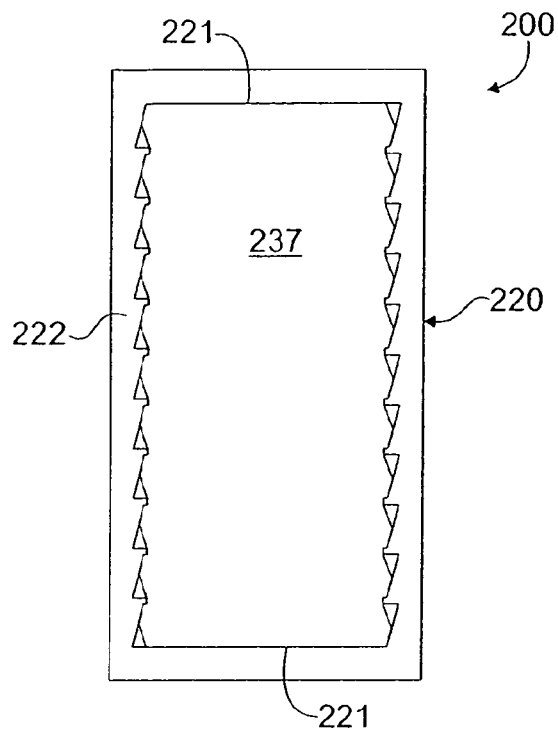

With reference to FIGS. 16A-16D, a still a further lid fabrication method in accordance with the present invention utilizes a "Venetian blind" approach. This approach comprises a wet etch (wet anisotropic crystallographic etch) in which a series of thin rectangular pits 231 are etched into a lid wafer 210 proximate to one another. The lid wafer 210 may comprise (110) silicon, for example. The pits 231 are patterned into the surface of the lid wafer 210 to cover areas of a silicon lid wafer 210 at which each cavity 230 is to be formed, as shown in FIG. 16A. Thin separating walls 233 are disposed between respective slot pairs, as shown FIG. 16A. Typically, the separating walls 233 have a thickness, for example of 0 to 50 microns. The spacing between the etch pit apertures on the mask may be chosen to allow the separating walls 233 to collapse and/or etch away near the end of the etching process. Alternatively, an isotropic etch may be used to remove the separating walls 233, although this may be less desirable as it can increase the surface roughness on the two sidewalls 221 that are to be used for optical signal transmission.

Figure 16C:
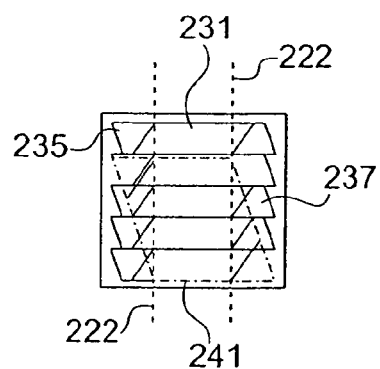
Figure 16D:
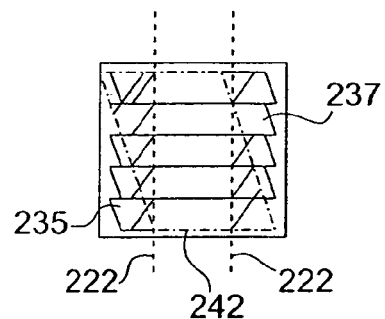

The Venetian blind approach can permit a smaller cavity to be formed than would otherwise be possible by etching through a mask having a single aperture for each cavity 230. For example, with reference to FIGS. 16C and 16D, distinctions between forming a cavity as a single cavity 241 and the Venetian blind approach are illustrated. FIG. 16C, for example, shows two approaches to making cavities with the same overall width (width refers to the dimension along the long axis of a pit 231) and same cleared width between dashed lines 222. FIG. 16D shows a single pit 242 having a length that matches that of the combined pits 231. (Length refers to the direction along lines 222.) The region between the dashed lines 222 represents the completely cleared area within the overall cavity 237 encompassed by the pits 231. That is to say, one could insert a cube with sides parallel to the dashed lines 222 into the cavity 237, and the cube would generally not interfere with any of the facets 235 seen in the cavity 237. The cube would sit substantially flat on the bottom of the pit 231. Of course the length of the cube would depend on the length of the cavity 237.

A representative cavity 241 may be created by patterning a large opening and etching to a depth D. At D, this cavity 241, 242 comprises a width disposed between the dashed lines 222. The corresponding cleared length is set by the length of the cavity 241. In contrast, using the Venetian blind approach to cavity creation, a series of pits 231 are provided having an etched depth D.

The two cavities 237, 241 shown in the FIG. 16C generally have the same width, the same cleared area, and different lengths. The cleared width of a pit 231 etched from a single contiguous mask aperture may be extended, for example, by reducing the etch depth, widening the mask pattern, or a combination thereof. If the depth and width are fixed, or if it is desired to keep them to a minimum to provide a smaller lid, the length of the pit 231 is constrained by the depth and the width. FIG. 16D shows the result if the single cavity 242 is extended in length without regard to the width. In this case, the depth remains the same. The cavity 241 represents the limit of cavity length (or "unit length") for a given width and depth. However, as shown in FIG. 16C, the length of the cavity 237 can be extended without an increase in width or decrease in depth by dividing the cavity 237 into multiple pits 231, as contrasted to the cavity 241. In other words, the final length of the cavity 237 may be freely chosen by varying the number of pits 231 utilized. For a given length, width, and depth, the number of pits 231 to create the cavity 237 is given by the ratio of the desired total length to the individual pit length, rounding the ratio up to the next whole number. The cavity 237 may be created by a minimum of two pits 231.

In forming the lids shown in FIGS. 16A-16D, the process may begin with selecting a lid wafer 210 of appropriate orientation and size based on the desired dimensions of the preferred cavity 237. Then, an appropriate hard masking material may be deposited for wet silicon etching based on desired silicon etchant. (e.g., a silicon nitride mask with KOH etchant.) Next, the hard mask is aligned and patterned with simple photolithography and dry or wet etching of silicon nitride. Afterwards, the lid wafer 219 is etched in the etchant to a selected depth.

At this point, the pits 231 are created and finished. If multiple pits 231 are used to create a cavity 237 in the (110)-etch case, optionally additional steps may be used to remove the separating walls 233 between the pits 231. Such additional steps include, for example, breaking the walls out mechanically, etching with an isotropic etchant, and the like. The original mask pattern may be designed such that the separating walls 231 disappear at the conclusion of the anisotropic wet etch due to mask undercut. An SOI lid wafer may be used as an etch stop if desired for this process as well.

g. Crystallographic Etch at 45°

Figure 17A:
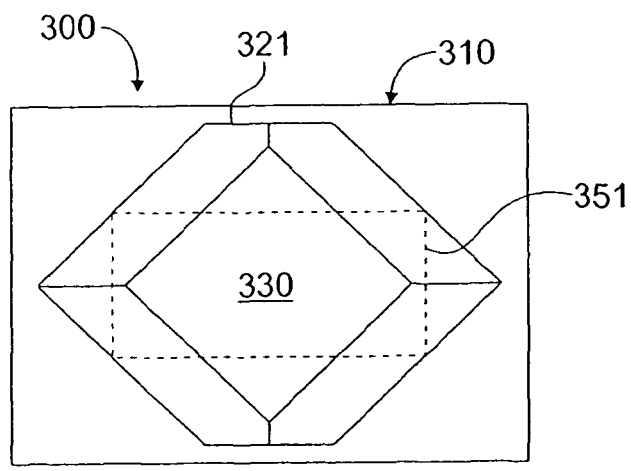
FIGS. 17A and 17B schematically illustrate a top view and a side elevational view, respectively, of another process in accordance with the present invention for fabricating cavitated lids on a lid wafer.
Figure 17B:
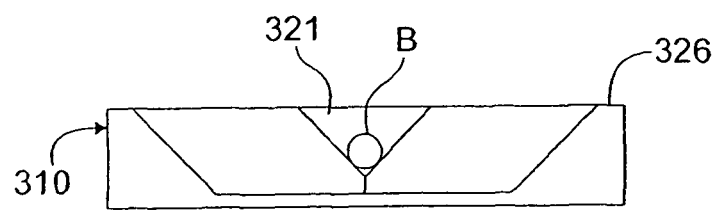

As a further exemplary lid fabrication method in accordance with the present invention, a crystallographic etch of (100) silicon with the mask oriented at a 45° angle to the <110> direction may be used, as illustrated in FIGS. 17A and 17B.

A rectangular mask aperture 351 may be provided over the lid wafer 210. In creating a lid 300, a large overall lid size may be required to create an appropriately sized sidewall 321 through which a beam may be passed. The lid 300 may have a flat lid sealing surface 326 to which an adhesive may be applied. For example, assuming that the size of the lid sealing surface 326 is fixed, the size of the lid 300 formed by the present method is dictated, for example, by the desired size of the sidewall 321. Before reaching the critical depth B at which point the sidewall 321 form a triangle with a pointed apex B, the sidewall 321 comprises a truncated triangle. As the etching progresses, the shape of the sidewall 321 approaches a generally triangular shape by simultaneously getting deeper and narrower. The angles of the sidewall edges are generally constant. At the critical depth, the sidewalls 321 meet to provide a generally triangular sidewall 321. As the etching continues, the edges of each sidewall 321 continue to approach each other and the bottom apex moves toward the upper wafer surface from which the etching is performed. If etching continues for a sufficiently long period, the triangular vertical sidewall 321 disappears and only a pyramidal pit is left with no vertical surfaces. This is the same pit as if the lid wafer 310 were patterned with a larger aperture and aligned parallel to the {111} planes in typical manner.

The finished size of the sidewall 321 can be adjusted, for example, by changing the width of the mask pattern, changing the desired depth of the pit, or both. If the width of the mask pattern is fixed, the size of the sidewall 321 decreases with depth of the pit. If the depth of the pit is fixed, the size of the sidewall 321 decreases with decreasing mask pattern width. Furthermore, the overall width of the pit (and thus the sidewall 321) decreases with decreasing mask aperture width. The illustration of FIG. 17B depicts a minimum depth and width (and thus overall lid size) to allow a beam "B" to pass through the sidewall 321 while leaving the appropriate distance between the beam and lid surface for our design.

In the foregoing processes, known etchants, for example, alkaline hydroxides such as KOH and TMAH, or EDP, as well as other known, more oxide selective anisotropic etchants may be employed. EDP may, for example, produce less surface roughness on <111> crystal plane surfaces. Further, techniques such as adding surfactants to improve surface roughness may be employed as is known in the art to achieve the desired final shape and surface finish in anisotropic etching. Low stress layers, for example, low stress nitrides, may be employed as a mask material for wet etching. A silicon oxide such as $SiO_2$, a metal (e.g. Cr, Al, Ni), a resist, or a combination thereof may be used as a mask material for dry etching. The masks may be patterned using known techniques.

In addition, when using wet etching processes, it is possible to define the pits using a hard mask of silicon nitride with a patterned thin film solder (e.g., eutectic or near eutectic Au—Sn composition, In, Sn—Pb, In—Cu, transient liquid phase (TLP) materials, TAD materials, and the like) on the top of the sidewalls 220. The solder can hold up to several of the anisotropic etches with suitable results, allowing one to have a solder ring on the surface ready for sealing the lids 200 to the base wafer 110. The thickness, composition, melting point, and pattern may depend, for example, on roughness, the lid mounting region 60, the bonding hierarchy, etc. A typical thickness for the solder is, for example, 3 to 8 microns. Furthermore, adhesion layers and diffusion barriers such as those described above, for example, Cr/Ni, Cr/Pt, Ti/W, and the like, may be used under the solder. The solder may exist on the lid 200, the base wafer 110, or both. The solder may be compositionally divided between the two to prevent it from reacting or diffusing deleteriously during other stages of the thermal processing. (In some cases, solder is not needed when the lid 200 is sealed by epoxy bonding, anodic bonding, fusion bonding, HF or other low temperature covalent bonding, Au—Au bonding, etc.)

It may be desired to deposit various coatings, for example, an antireflective (AR) coating, at a temperature higher than that compatible with the solder or metal on the sealing surface of the lid wafer. After etching of the lid, the mask is optionally stripped—metal masks are typically stripped. The wafer may then be AR coated, for example, by conformal CVD, using reactants such as an organometallic compound, silane, dichlorosilane, oxygen and nitrogen. The deposition typically is conducted at a temperature above 400° C., which is incompatible with most solders and metals. After AR coating, the wafer or grid of parts may be aligned on a shadow mask containing a series of rotationally asymmetric openings that trace the solder pattern desired. For example, if the grid of lids includes cavities 100 microns in thickness, a shadow mask can be employed. A shadow mask is typically an etched thin metal having openings through which an evaporated stream of metal can be deposited.

Continuous coverage of the sealing surface while preventing metal deposition or "overspray" on the interior or exterior wall surfaces is desired when the lid is used for light transmission or to contain waveguides. The shadow mask may be constructed, for example, with an open ring tracing the lid's sealing surface, repeated for each device on the wafer or grid. The shadow mask may be aligned to the part with a desired accuracy, which is a function of the overlap and undersizing of the shadowmask on the lid sealing surface. For example, a 100 micron wall may utilize a 75 micron opening in the shadowmask, typically requiring at least ±12.5 microns of alignment between the two to prevent metallic overspray on the sidewalls. In practice, the alignment is typically better than this minimum as there is often a gap between the shadow mask and the part which should be taken into account. The alignment can readily be determined based, for example, on the alignment technique, metals deposited, and separation and alignment of the evaporation source and substrate.

The mask design may include an open ring with a metal center, which shields the interior volume of the lid cavity. The open ring may be broken in one or more places by a land which attaches the body of the shadow mask metal with the metal center. The land which attaches the center and the body of the mask may be disposed in such a way that when the lid is rotated 180 degrees, a second metallization produces continuous coverage all around the sealing surface. If the metal centers of the sealing mask are attached by more than one land, they may be placed asymmetrically so that uninterrupted metallization can be achieved. For example, the mask may be formed of 3 mil thick stainless steel with two lands that are each 2 to 3 mils, that attach the interior of the mask metal center to a 4 mil ring. The lands may be placed asymmetrically so that when the wafer or grid is rotated 180 degrees, a complete metallization of the sealing surface can be achieved.

The mask can be formed by depositing a first wettable metallization, for example, Cr (50 nm)/Ni (200 nm)/Au (200 nm). The part is rotated by a designed value, for example, 90 or 180 degrees. A second metallization may be performed using the same or different structure and thickness as the first metallization structure. The solder, for example, Au—Sn (2 to 10 microns), is next deposited. A solder-wettable metal ring can thus made from two deposition steps. The solder may be deposited continuously over the bonding surface and covers the same surface except for small gaps in the location of the metal lands. When the lid is applied to the base wafer and the solder is reflowed, the small gap is filled with solder by wicking action. This gap may also help to prevent a vapor seal from forming during a subsequent bake-out step which may be used to remove moisture and condensable vapors prior to hermetic sealing of the lids to the bases.

Figure 18A:
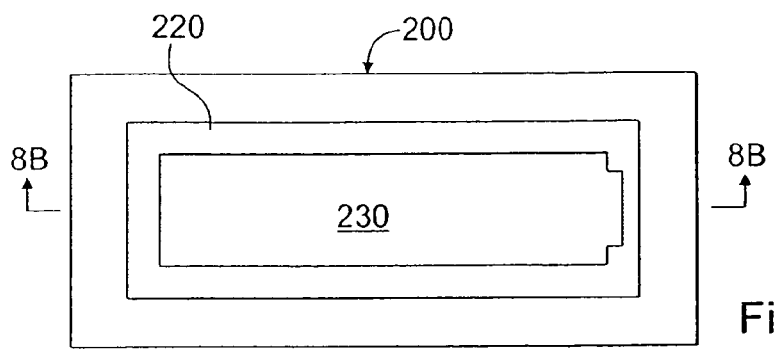
FIGS. 18A-18D schematically illustrate a lid having a glassy sidewall portion.
Figure 18B:
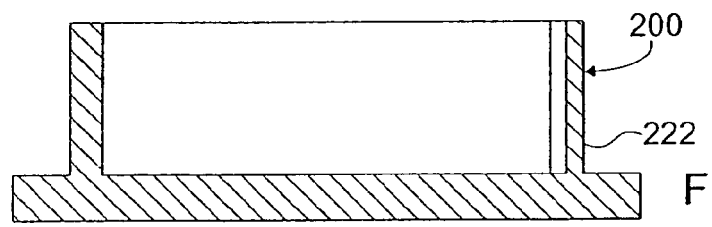
Figure 18C:
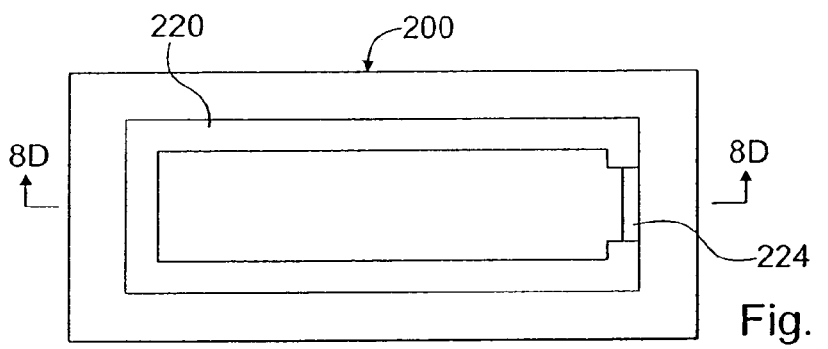
Figure 18D:
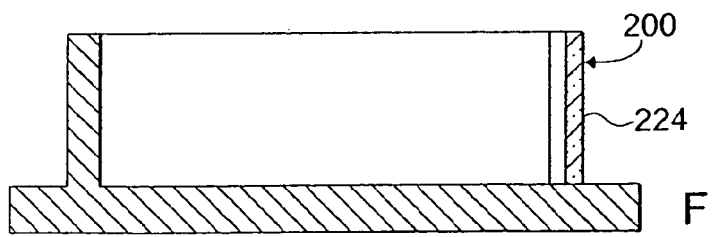

While silicon is effective for transmitting wavelengths greater than 1100 nm, it may be desirable in certain applications to have the capability of transmitting wavelengths in the visible spectrum and near IR through the lid 200. This capability may be useful, for example, in packaging pump lasers, VCSELS, many sensors, and the like. In this regard, a sidewall portion in the silicon lid that is optically transparent at a desired wavelength may be provided. For example, referring to FIGS. 18A-18D, a silicon lid 200 may be fabricated in (100) single crystal silicon by the methods described above. Then, a portion of the sidewall 222 may be thinned to a thickness of 5-30 microns, as shown in FIGS. 18A and 18B. The lid with a thinned sidewall 222 may then be thermally oxidized for sufficient time period to cause the entire depth of the sidewall 22 to oxidized to silicon dioxide, which is optically transparent to the visible spectrum, as shown in FIGS. 18C and 18D. To reduce mechanical stress that may result from the resulting change in solid volume, the use of etched posts or rectangles that grow into each other during oxidation to create a solid wall may be utilized. Such posts may be created by dry etching, wet etching, or both.

Where an SOI wafer can be used, the lid wafer 210 may comprise two separate wafers that are later bonded, one for sidewalls 220 and another sealed later for the roof 250. Further, when dry etching is used, added alignment features such as holes for alignment pins, or a front nozzle to aid in aligning to ferrule sleeves can readily be incorporated into the design.

D. Hermeticity Testing

In accordance with a further aspect of the invention, the hermeticity of the device package can conveniently be tested. The lid dimensions are selected such that the roof 250 deflects to a measurable degree in response to a change or loss in hermeticity. A measurement instrument, for example, an interferometer, can be used for this purpose. The package is filled with an inert gas, for example, helium or nitrogen, during fabrication to create a bulge in the lid. The ratio of the thickness of the roof 250 to the longest dimension (span) of the cavity 230 is typically $\frac{1}{10}$ to $\frac{1}{50}$. For example, for a lid 200 having a cavity span of 1 mm, a 40 micron lid thickness may provide adequate deflection and durability. The lid thickness is typically between 20 and 100 microns. As the degree of the lid bulge is related to the pressure in the package, the degree of change in the lid bulge is indicative of the hermeticity and leak rate.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

In addition to the above-described technique for testing hermeticity, one may alternatively fill the package with a detectable gas, for example, helium, and use standard leak detection equipment to measure the leak rate from the package.

What is claimed is:

1. A method of detecting leakage in a sealed micro-optical device package, comprising:
    (a) providing a sealed micro-optical device package containing a micro-optical device, wherein the micro-optical device package comprises a semiconductor material and is sealed under conditions providing a measurable deflection in a semiconductor wall of the package, and wherein the extent of deflection is dependent on the difference in pressure between the inside and outside of the package; and
    (b) measuring the deflection of the wall after sealing the micro-optical device package.

2. The method according to claim 1, wherein the micro-optical device comprises a laser diode.

3. The method according to claim 2, wherein the package includes a semiconductor lid having a generally rectangular shape having four sidewalls that intersect at each end to form a rectangular perimeter and a roof connected to the sidewalls to provide a cavity therebetween, and wherein the wall of the package is the roof of the lid.

4. The method according to claim 3, wherein the step of measuring comprises measuring deflection with an interferometer.

5. The method according to claim 4, wherein the lid comprises single crystal silicon, and wherein the lid is fabricated using wet crystallographic etching of single crystal silicon.

6. The method according to claim 5, wherein the step of providing a sealed micro-optical device package comprises sealing the package under vacuum.

7. The method according to claim 6, wherein the ratio of the thickness of the roof to the longest dimension of the cavity is between $\frac{1}{10}$ to $\frac{1}{50}$.

8. The method according to claim 7, wherein roof thickness is about 50 microns and the longest dimension of the cavity is about 2 mm.

9. A sealed micro-optical device package, comprising:
    a substrate;
    a lid comprising a semiconductor material over the substrate;
    a sealed volume between the substrate and the lid; and
    a micro-optical device disposed in the sealed volume;
    wherein the sealed volume is at a pressure below atmospheric pressure, such that a wall of the lid has a measurable deflection, with the extent of deflection dependent on the sealed volume pressure.

10. The sealed micro-optical device package according to claim 9, wherein the micro-optical device comprises a laser diode.

11. The sealed micro-optical device package according to claim 10, wherein the lid comprises single crystal silicon.

12. The sealed micro-optical device package according to claim 11, wherein the lid comprises a generally rectangular shape having four sidewalls that intersect at each end to form a rectangular perimeter and a roof connected to the sidewalls to provide a cavity therebetween, and wherein the wall of the lid is the roof.

13. The sealed micro-optical device package according to claim 12, wherein the ratio of the thickness of the roof to the longest dimension of the cavity is between 1/10 to 1/50.

14. The sealed micro-optical device package according to claim 13, wherein roof thickness is about 50 microns and the longest dimension of the cavity is about 2 mm.

15. A method of detecting leakage in a sealed micro-optical device package, comprising:
(a) providing a substrate having a micro-optical device disposed thereon;
placing a lid comprising a semiconductor material over the micro-optical device and the substrate; and
sealing the lid under vacuum to the substrate to provide the sealed micro-optical device package, the sealed micro-optical device package including a sealed volume between the substrate and the lid having a pressure below atmospheric pressure such that a wall of the lid has a measurable deflection; and
(b) measuring the deflection of the wall after sealing the micro-optical device package.

16. The method according to claim 15, wherein the micro-optical device comprises a laser diode.

17. The method according to claim 16, wherein the lid comprises a generally rectangular shape having four sidewalls that intersect at each end to form a rectangular perimeter and a roof connected to the sidewalls to provide a cavity therebetween, and wherein the wall of the lid is the roof.

18. The method according to claim 17, wherein the step of measuring comprises measuring deflection with an interferometer.

19. The method according to claim 18, wherein the lid comprises single crystal silicon, and wherein the step of placing the lid comprises fabricating the lid by wet crystallographic etching of single crystal silicon.

20. The method according to claim 19, wherein the ratio of the thickness of the roof to the longest dimension of the cavity is between 1/10 to 1/50.

21. The method according to claim 20, wherein roof thickness is about 50 microns and the longest dimension of the cavity is about 2 mm.

* * * * *